(12) United States Patent
Cheng et al.

(10) Patent No.: US 8,546,203 B1
(45) Date of Patent: Oct. 1, 2013

(54) SEMICONDUCTOR STRUCTURE HAVING NFET EXTENSION LAST IMPLANTS

(75) Inventors: Kangguo Cheng, Schenectady, NY (US); Bruce B. Doris, Brewster, NY (US); Bala S. Haran, Watervliet, NY (US); Pranita Kulkarni, Slingerlands, NY (US); Nicolas Loubet, Guilderland, NY (US); Amlan Majumdar, White Plains, NY (US); Stefan Schmitz, Ballston Spa, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/551,100

(22) Filed: Jul. 17, 2012

(51) Int. Cl.
*H01L 21/00* (2006.01)

(52) U.S. Cl.
USPC ............ 438/154; 438/166; 257/347; 257/350; 257/351; 257/E21.415; 257/E29.02; 257/E21.632

(58) Field of Classification Search
USPC ................. 438/154, 166; 257/347, E29.285, 257/E21.415, E29.02, E21.632, 350, 351
See application file for complete search history.

(56) References Cited

U.S. PATENT DOCUMENTS

| | | | | |
|---|---|---|---|---|
| 4,072,545 A | * | 2/1978 | De La Moneda | 438/294 |
| 5,079,180 A | * | 1/1992 | Rodder et al. | 438/297 |
| 5,516,707 A | | 5/1996 | Loh et al. | |
| 6,157,064 A | * | 12/2000 | Huang | 257/344 |
| 6,344,396 B1 | | 2/2002 | Ishida et al. | |
| 6,346,447 B1 | * | 2/2002 | Rodder | 438/300 |
| 6,429,084 B1 | * | 8/2002 | Park et al. | 438/305 |
| 6,746,924 B1 | * | 6/2004 | Lee et al. | 438/286 |
| 6,891,228 B2 | | 5/2005 | Park et al. | |
| 6,982,216 B1 | * | 1/2006 | Yamashita | 438/525 |
| 7,118,980 B2 | | 10/2006 | Jain | |
| 7,176,481 B2 | | 2/2007 | Chen et al. | |
| 7,553,763 B2 | | 6/2009 | Hsiao et al. | |
| 7,592,270 B2 | | 9/2009 | Teo et al. | |
| 7,714,358 B2 | | 5/2010 | Liu et al. | |
| 7,808,001 B2 | * | 10/2010 | Takeoka | 257/69 |
| 7,825,003 B2 | * | 11/2010 | Gauthier et al. | 438/423 |
| 7,855,105 B1 | * | 12/2010 | Jagannathan et al. | 438/142 |

(Continued)

OTHER PUBLICATIONS

A. Majumdar et al., "High-Performance Undoped-Body 8-nm-Thin SOI Field-Effect Transistors," IEEE Electron Device Letters, vol. 29, Issue 5, May 2008, pp. 515-517.

(Continued)

*Primary Examiner* — Bac H. Au
*Assistant Examiner* — Victor Barzykin
(74) *Attorney, Agent, or Firm* — Law Offices of Ira D. Blecker, P.C.

(57) ABSTRACT

Method of forming a semiconductor structure which includes an extremely thin silicon-on-insulator (ETSOI) semiconductor structure having a PFET portion and an NFET portion, a gate structure in the PFET portion and the NFET portion, a high quality nitride spacer adjacent to the gate structures in the PFET portion and the NFET portion and a doped faceted epitaxial silicon germanium raised source/drain (RSD) in the PFET portion. Low quality nitride and high quality nitride are formed on the semiconductor structure. The high quality nitride in the NFET portion is damaged by ion implantation to facilitate its removal. A faceted epitaxial silicon RSD is formed on the ETSOI adjacent to the high quality nitride in the NFET portion. The high quality nitride in the PFET portion is damaged by ion implantation to facilitate its removal. Extensions are ion implanted into the ETSOI underneath the gate structure in the NFET portion.

23 Claims, 24 Drawing Sheets

(56) References Cited

U.S. PATENT DOCUMENTS

| | | | |
|---|---|---|---|
| 8,030,708 B2* | 10/2011 | Tateshita | 257/369 |
| 8,124,427 B2* | 2/2012 | Berliner et al. | 438/14 |
| 8,169,024 B2* | 5/2012 | Cheng et al. | 257/347 |
| 2006/0128111 A1* | 6/2006 | Beintner et al. | 438/400 |
| 2007/0257315 A1 | 11/2007 | Bedell et al. | |
| 2008/0179636 A1* | 7/2008 | Chidambarrao et al. | 257/255 |
| 2008/0217686 A1* | 9/2008 | Majumdar et al. | 257/347 |
| 2009/0039426 A1* | 2/2009 | Cartier et al. | 257/344 |
| 2009/0140338 A1 | 6/2009 | Gauthier et al. | |
| 2009/0280614 A1* | 11/2009 | Chen et al. | 438/305 |
| 2009/0289305 A1* | 11/2009 | Majumdar et al. | 257/351 |
| 2010/0120263 A1 | 5/2010 | Hsueh et al. | |
| 2011/0027956 A1 | 2/2011 | Domenicucci et al. | |
| 2011/0049630 A1* | 3/2011 | Majumdar et al. | 257/351 |
| 2011/0163359 A1* | 7/2011 | Zhu | 257/288 |
| 2011/0230030 A1* | 9/2011 | de Souza et al. | 438/303 |
| 2011/0254090 A1* | 10/2011 | Cheng et al. | 257/347 |
| 2011/0309446 A1* | 12/2011 | Doris et al. | 257/351 |
| 2012/0049284 A1* | 3/2012 | Doris et al. | 257/350 |
| 2012/0061759 A1* | 3/2012 | Cheng et al. | 257/347 |
| 2012/0104498 A1* | 5/2012 | Majumdar et al. | 257/351 |
| 2012/0108026 A1* | 5/2012 | Nieh et al. | 438/300 |
| 2012/0153393 A1* | 6/2012 | Liang et al. | 257/347 |
| 2012/0153398 A1* | 6/2012 | Baars et al. | 257/369 |
| 2012/0187523 A1* | 7/2012 | Cummings et al. | 257/506 |
| 2012/0241868 A1* | 9/2012 | Tsai et al. | 257/369 |
| 2012/0256278 A1* | 10/2012 | Zhang et al. | 257/411 |
| 2012/0261757 A1* | 10/2012 | Doris et al. | 257/351 |
| 2012/0286364 A1* | 11/2012 | Cheng et al. | 257/369 |
| 2012/0299101 A1* | 11/2012 | Babich et al. | 257/347 |
| 2012/0313168 A1* | 12/2012 | Cheng et al. | 257/347 |
| 2013/0015525 A1* | 1/2013 | Cheng et al. | 257/351 |

OTHER PUBLICATIONS

A. Majumdar et al., "Gate Length and Performance Scaling of Undoped-Body Extremely Thin SOI MOSFETs," IEEE Electron Device Letters, vol. 30, Issue:4, Apr. 2009, pp. 413-415.

K. Cheng et al., "Extremely thin SOI (ETSOI) CMOS with record low variability for low power system-on-chip applications," 2009 IEEE International Electron Devices Meeting (IEDM), Dec. 7-9, 2009, 4 pages.

R. Lindsay et al., "Optimisation of Junctions formed by Solid Phase Epitaxial Regrowth for sub-70nm CMOS," Mat. Res. Soc. Symp. Proc. vol. 717, 2002, pp. C.2.1-C.2.12.

Prosecution history for related U.S. Appl. No. 13/551,054, Office Action having a Notification Date of May 24, 2013.

* cited by examiner

SEMICONDUCTOR STRUCTURE HAVING NFET EXTENSION LAST IMPLANTS

RELATED APPLICATION

This application is related to U.S. patent application Ser. No. 13/551,054, entitled "SEMICONDUCTOR STRUCTURE HAVING NFET EXTENSION LAST IMPLANTS" and filed even date herewith, the disclosure of which is incorporated by reference herein.

BACKGROUND

The present invention relates to semiconductor structures and, more particularly, to semiconductor structures having NFET extension last implants.

ETSOI (extremely thin silicon-on-insulator) is a leading candidate for continued scaling of planar silicon technology. Successful introduction of ETSOI into manufacturing requires integration of n-type metal oxide semiconductor (nMOS) and p-type metal oxide semiconductor (pMOS) devices with high performance and low leakage. ETSOI devices naturally have low leakage currents due to the extremely thin SOI layer (typically less than 10 nm). However, this extremely thin SOI layer often leads to high series resistance that lowers drive current and degrades performance. A key feature to reduce series resistance in ETSOI and therefore, improve performance, is the use of raised/source drain (RSD) epitaxy. Ideal junction design for ETSOI devices with RSD epitaxy involves (i) low source/drain resistance (ii) low extension resistance and (iii) good link-up between source/drain and extension.

BRIEF SUMMARY

The various advantages and purposes of the exemplary embodiments as described above and hereafter are achieved by providing, according to a first aspect of the exemplary embodiments, a method of forming a semiconductor structure which includes: (a) obtaining an extremely thin semiconductor-on-insulator (ETSOI) wafer having a PFET portion where a p-type field effect transistor (PFET) will be formed and an NFET portion where an n-type field effect transistor (NFET) will be formed; (b) forming at least one gate structure in the PFET portion and at least one gate structure in the NFET portion; (c) depositing a first high quality nitride over the PFET portion and the NFET portion, the high quality nitride being unetchable in dilute hydrofluoric acid (HF); (d) depositing a first low quality nitride over the first high quality nitride, the first low quality nitride being etchable in dilute HF; (e) etching the PFET portion to remove the first high quality nitride and first low quality nitride except for first high quality nitride and first low quality nitride adjacent to the at least one gate structure in the PFET portion; (f) etching the PFET portion and the NFET portion to remove the first low quality nitride, resulting in first high quality nitride spacers adjacent to the at least one gate structure in the PET portion and first high quality nitride over the NFET portion; (g) forming doped faceted epitaxial silicon/germanium (SiGe) on the ETSOI adjacent to the first high quality nitride and the at least one gate structure in the PFET portion to form a faceted raised source/drain (RSD) in the PFET portion; (h) depositing a second low quality nitride over the PFET portion and the NFET portion and depositing a second high quality nitride over the second low quality nitride; (i) etching the NFET portion to remove the second high quality nitride and the second low quality nitride except for second high quality nitride and second low quality nitride adjacent to the at least one gate structure in the NFET portion; (j) ion implanting into the NFET portion to damage the first and second high quality nitrides; (k) etching the NFET portion to remove the damaged first and second high quality nitrides and the second low quality nitride resulting in first high quality nitride spacers adjacent to the at least one gate structure in thee NFET portion; (l) ion implanting to damage the second high quality nitride in the PFET portion; (m) etching to remove the damaged second high quality nitride and second low quality nitride from the PFET portion; (n) forming a faceted epitaxial silicon RSD on the ETSOI adjacent to the first high quality nitride spacers in the NFET portion; (o) performing a rapid thermal anneal; (p) ion implanting extensions into the ETSOI underneath the at least one gate structure in the NFET portion; and (q) performing a short time scale anneal to activate the NFET extension implants but not diffuse them.

According to a second aspect of the exemplary embodiments, there is provided a method of forming a semiconductor structure which includes: (a) providing a semiconductor structure comprising an extremely thin semiconductor on insulator (ETSOI) wafer having a PFET portion where a p-type field effect transistor (PFET) will be formed and an NFET portion where an n-type field effect transistor (NFET) will be formed, at least one gate structure in the PFET portion and at least one gate structure in the NFET portion, a high quality nitride spacer adjacent to the at least one gate structure in the PFET portion and a high quality nitride spacer adjacent to the at least one gate structure in the NFET portion, the high quality nitride being unetchable in dilute hydrofluoric acid (HF), and a doped faceted epitaxial silicon germanium raised source/drain (RSD) in the PFET portion; (b) depositing a low quality nitride over the PFET portion and the NFET portion and depositing a high quality nitride over the low quality nitride; (c) etching the NFET portion to remove the high quality nitride and the low quality nitride except for high quality nitride and low quality nitride adjacent to the high quality nitride spacer in the NFET portion; (d) ion implanting into the NFET portion to damage the high quality nitride; (e) etching the NFET portion to remove the damaged high quality nitride and the low quality nitride resulting in the high quality nitride spacers adjacent to the at least one gate structure in thee NFET portion; (f) ion implanting to damage the high quality nitride in the PFET portion; (g) etching to remove the damaged high quality nitride and the low quality nitride from the PFET portion; (h) forming a faceted epitaxial silicon RSD on the ETSOI adjacent to the high quality nitride spacer in the NFET portion; (i) performing a rapid thermal anneal; (j) ion implanting extensions into the ETSOI underneath the at least one gate structure in the NFET portion; and (k) performing a short time scale anneal to activate the NFET extension implants but not diffuse them.

BRIEF DESCRIPTION OF SEVERAL VIEWS OF THE DRAWINGS

The features of the exemplary embodiments believed to be novel and the elements characteristic of the exemplary embodiments are set forth with particularity in the appended claims. The figures are for illustration purposes only and are not drawn to scale. The exemplary embodiments, both as to organization and method of operation, may best be understood by reference to the detailed description which follows taken in conjunction with the accompanying drawings in which:

FIGS. 1 to 24 illustrate the processing to form a semiconductor structure according to the exemplary embodiments in which:

FIG. 1 illustrates the formation of gate structures on an ETSOI semiconductor substrate having PFET and NFET portions;

FIG. 2 illustrates the deposition of a high quality nitride on the ETSOI substrate and gate structures;

FIG. 3 illustrates the deposition of a low quality nitride on the high quality nitride;

FIG. 4 illustrates the masking of the NFET portion while etching the low quality nitride and high quality nitride in the PFET portion;

FIG. 5 illustrates the stripping of the mask from the NFET portion;

FIG. 6 illustrates the etching of the low quality nitride;

FIG. 7A illustrates a first exemplary embodiment of the formation of a doped epitaxial raised source/drain (RSD) on the PFET portion and FIG. 7B illustrates a second exemplary embodiment of the formation of a doped epitaxial raised source/drain (RSD) on the PFET portion;

FIG. 8 illustrates the deposition of a second low quality nitride and second high quality nitride on the first embodiment of the semiconductor structure;

FIG. 9 illustrates the etching of the second high quality nitride and the second low quality nitride in the NFET portion of the first embodiment of the semiconductor structure;

FIG. 10 illustrates the masking of the PFET portion and the implantation of a neutral species into the remaining high quality nitrides to cause damage to the high quality nitrides of the first embodiment of the semiconductor structure;

FIG. 11 illustrates the stripping of the mask from the PFET portion and the damage to the high quality nitrides in the NFET portion of the first embodiment of the semiconductor structure;

FIG. 12 illustrates the etching of the damaged high quality nitrides and the low quality nitride from the NFET portion of the first embodiment of the semiconductor structure;

FIG. 13 illustrates the forming of the RSD in the NFET portion of the first embodiment of the semiconductor structure;

FIG. 14 illustrates the masking of the NFET portion and the implantation of a neutral species into the second high quality nitride in the PFET portion to cause damage to the second high quality nitride of the first embodiment of the semiconductor structure;

FIG. 15 illustrates the stripping of the mask from the NFET portion and the etching of the damaged second high quality nitride and the second low quality nitride from the PFET portion of the first embodiment of the semiconductor structure;

FIGS. 16 to 19 illustrate the doping of the RSD in the NFET portion if it was not doped when formed of the first embodiment of the semiconductor structure;

FIG. 20 illustrates the masking of the PFET portion and the ion implanting of extensions in the NFET portion of the first embodiment of the semiconductor structure;

FIG. 21 illustrates the removal of the mask from the PFET portion and the short time scale anneal of the NFET portion to activate the extensions of the first embodiment of the semiconductor structure;

FIG. 22 illustrates the formation of nitride spacers in the PFET and NFET portions of the first embodiment of the semiconductor structure;

FIG. 23 illustrates the formation of a silicide layer in the PFET and NFET portions of the first embodiment of the semiconductor structure; and FIG. 24 illustrates the formation of a silicide layer in the PFET and NFET portions of the second embodiment of the semiconductor structure.

DETAILED DESCRIPTION

In the exemplary embodiments, an extension last complementary metal oxide semiconductor (CMOS) integration scheme is demonstrated with the following key elements for 20 nm node and beyond: (i) in-situ boron doped (ISBD) silicon germanium to reduce PFET series resistance, (ii) extension last NFET, and (iii) metal-gate/high-k gate structure.

Figure 1:
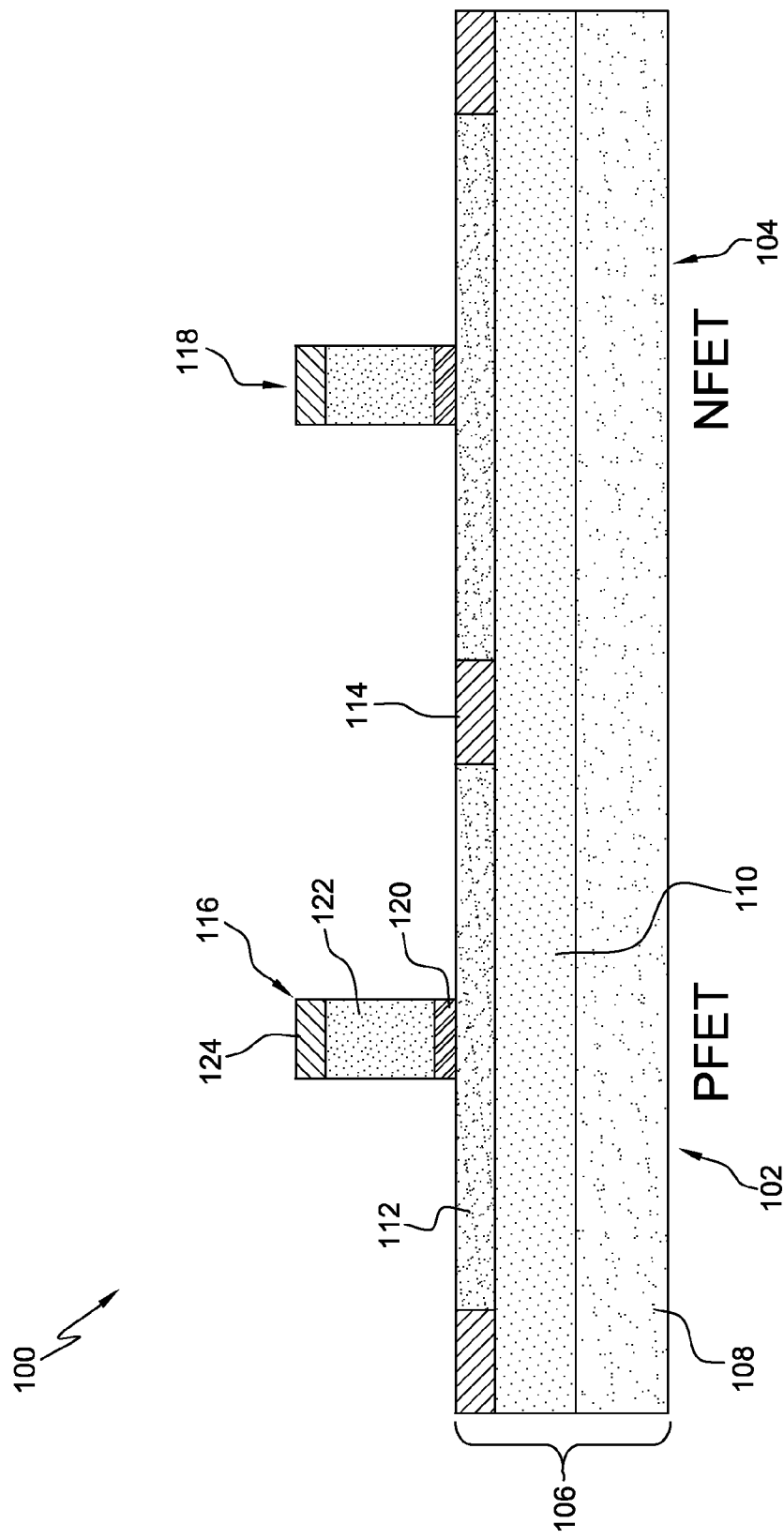

Referring to the Figures in more detail, and particularly referring to FIG. 1, there is shown a semiconductor structure 100 having a p-type field effect transistor (PFET) portion 102 and an n-type field effect transistor (NFET) portion 104. The PFET portion 102 is fabricated using pMOS technology while the NFET portion 104 is fabricated using nMOS technology.

The semiconductor structure 100 is fabricated using an ETSOI wafer 106 which includes a semiconductor substrate 108, usually silicon, a buried oxide layer 110 (also referred to as a BOX layer) and an ETSOI layer 112. The ETSOI layer 112 may have a thickness of about 2 to 10 nanometers which is substantially thinner than a typical SOI layer. The semiconductor structure 100 may also include shallow trench isolation (STI) 114 to separate the PFET portion 102 from the NFET portion 104. The ETSOI wafer 106 having STI 114 may be fabricated by conventional processing.

Semiconductor structure 100 may further include at least one gate structure 116 on PFET portion 102 and at least one gate structure 118 on the NFET portion. Each of the gate structures 116, 118 includes a gate dielectric 120, a gate conductor 122 and a nitride cap 124. Preferably, the gate dielectric 120 is a high-k gate dielectric and the gate conductor 122 is a metal gate conductor. The gate structures 116, 118 may be fabricated by depositing layers of gate dielectric, gate conductor and gate nitride followed by gate definition including photolithography, reactive ion etching (RIE) and resist strip. While there is only one PFET portion 102 and one NFET portion 102 shown in the Figures, it should be understood that the semiconductor structure 100 will typically have many such PFET portions 102 and NFET portions 104, each having at least one gate structure.

Figure 2:
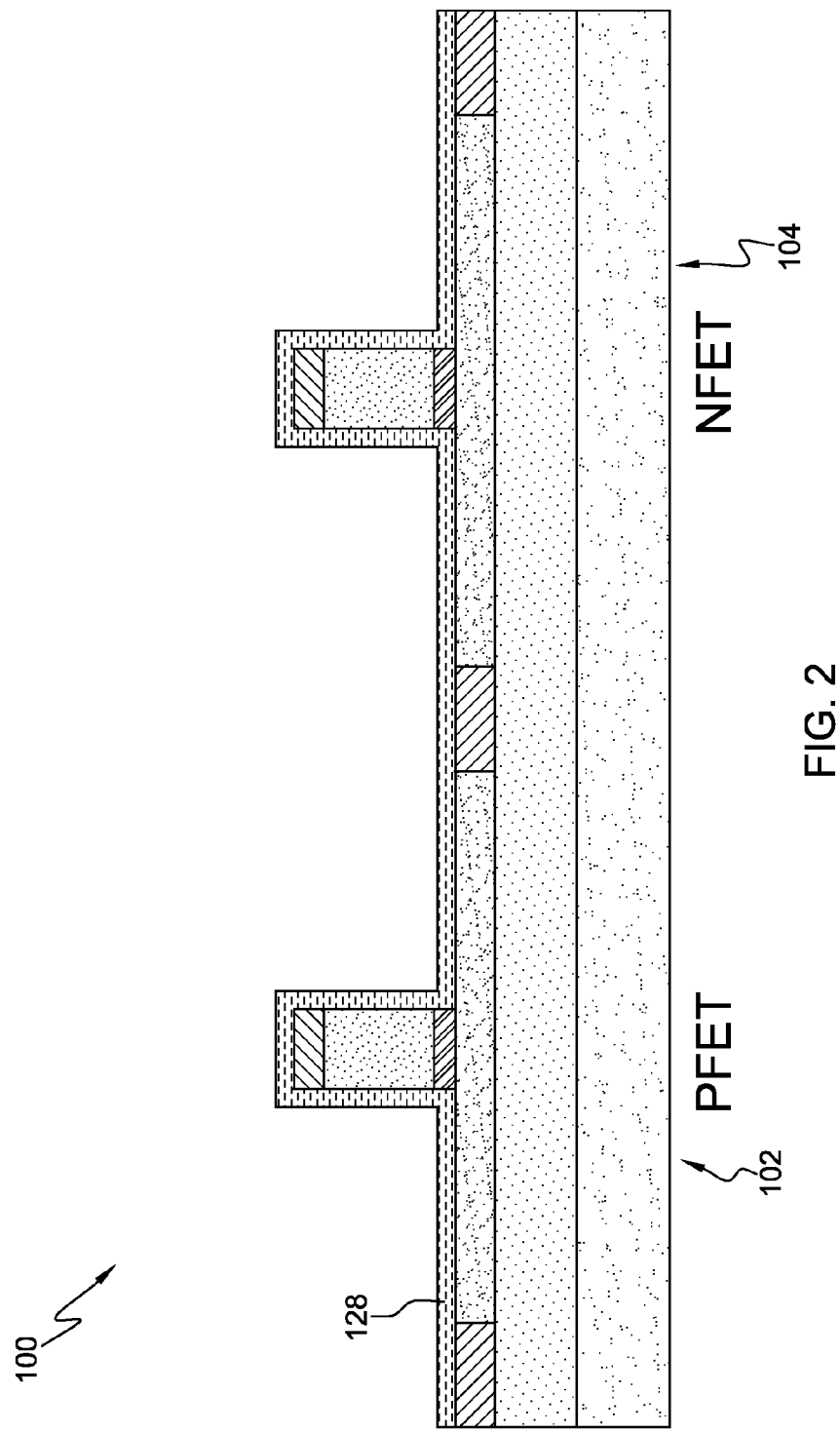
Figure 3:
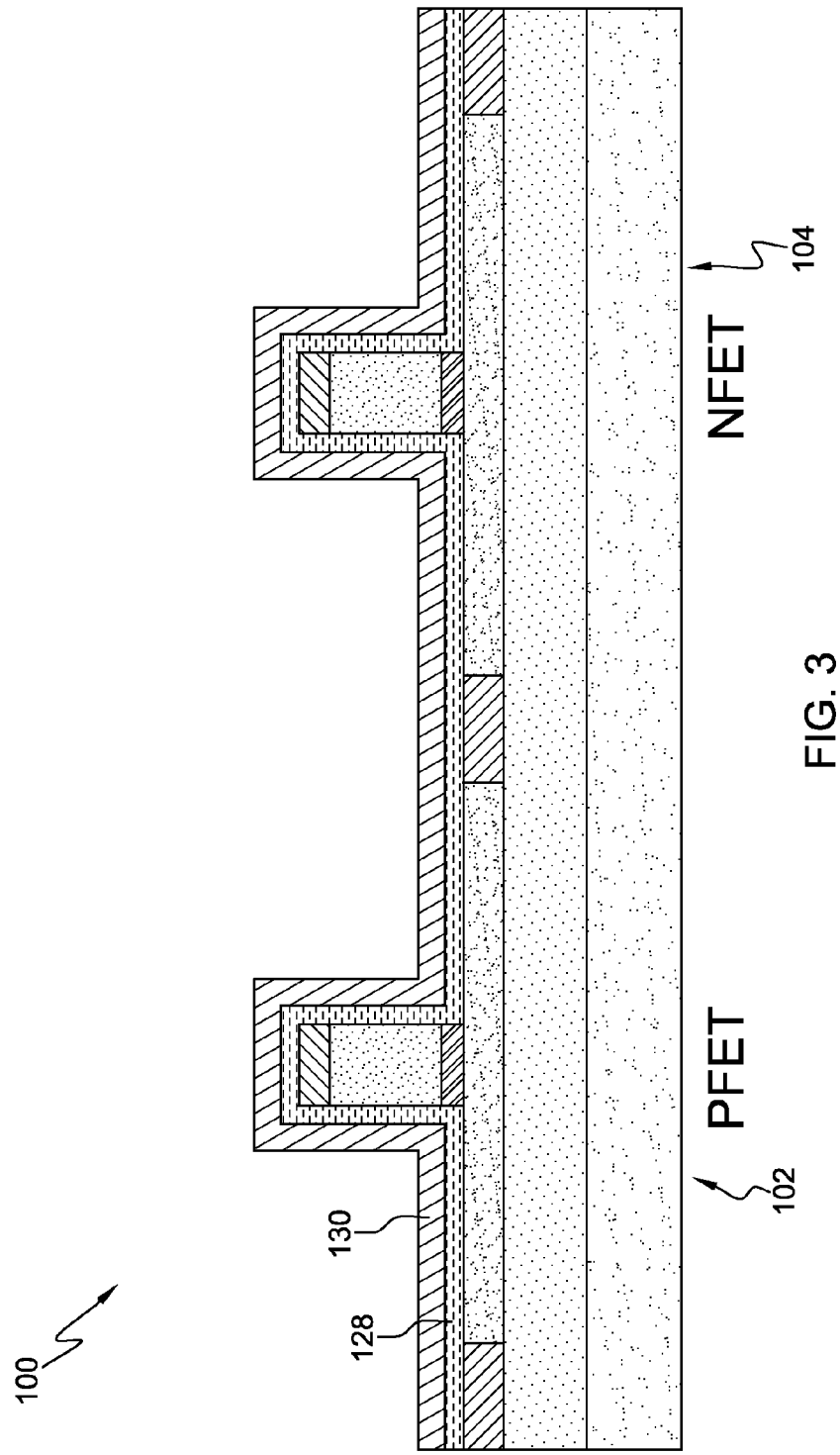

Referring now to FIG. 2, about 2 to 5 nanometers of a high quality nitride 128 is deposited everywhere. A high quality nitride is a nitride that has an etch rate in dilute hydrofluoric (HF) acid of less than about 1 nanometer per minute. Dilute HF may be defined as typically $HF:H_2O$ (water)=1:50 but may also range from 1:10 to 1:100. Some examples of high quality nitrides are nitrides deposited by low-pressure chemical vapor deposition (LPCVD) and rapid-thermal chemical vapor deposition (RTCVD).

Thereafter, as shown in FIG. 3, 2 to 5 nanometers of a low quality nitride 130 is deposited over the high quality nitride 128. A low quality nitride is a nitride that has an etch rate in dilute HF of more than about 10 nanometers per minute. Therefore, the low quality nitride etches at least 10 times faster than the high quality nitride in dilute HF. Some examples of low quality nitrides are nitrides deposited by plasma-enhanced chemical vapor deposition (PECVD).

Figure 4:
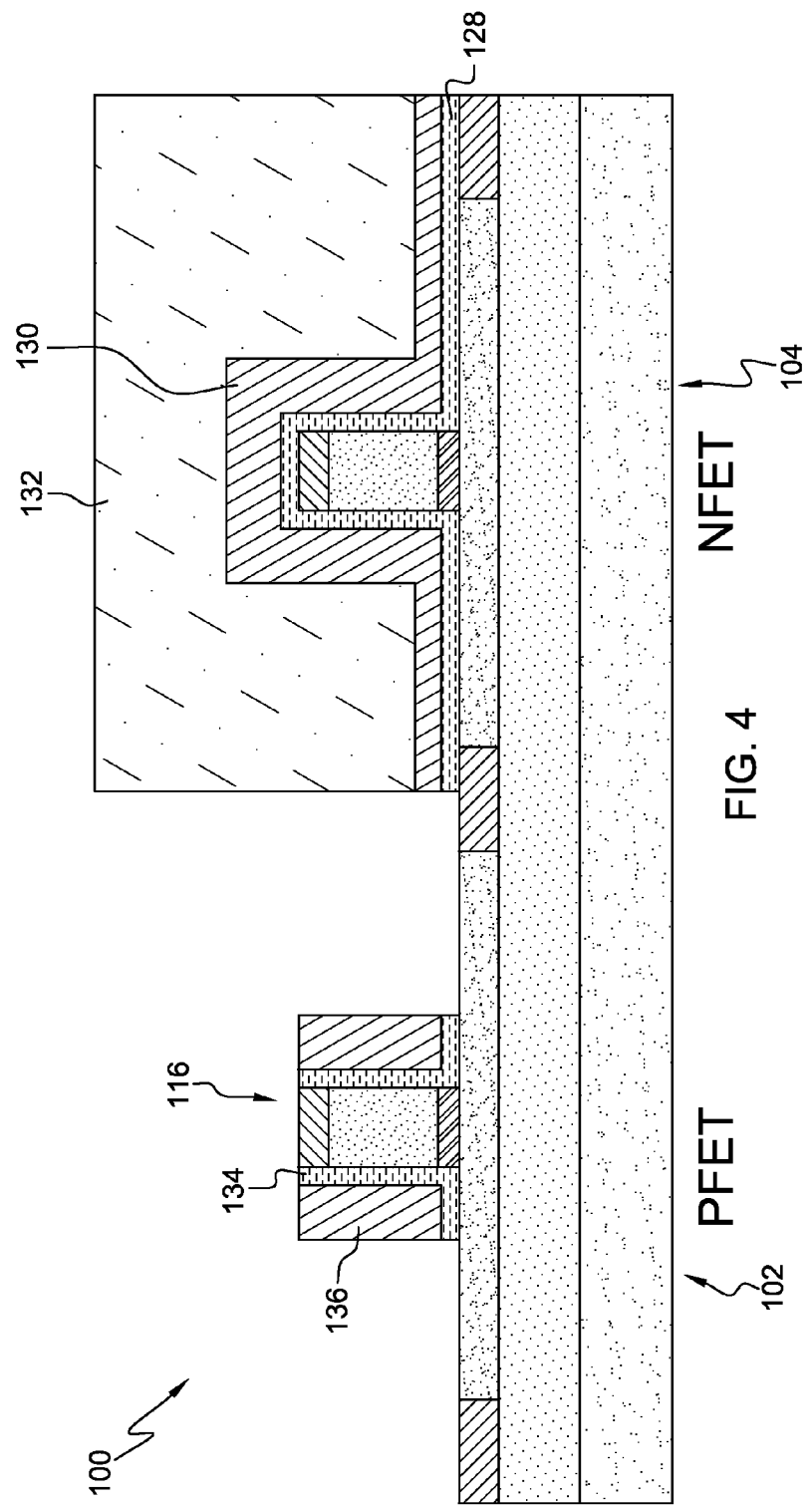

Referring now to FIG. 4, a photoresist mask 132 is defined to cover the NFET portion 104 of the semiconductor structure 100. Thereafter, by a two-step RIE process, the low quality nitride 130 and the high quality nitride 128 are etched in the PFET portion 102. In this two-step RIE process, the low quality nitride 130 is etched and then the RIE settings are adjusted to then etch the high quality nitride 128. The nitride RIE is performed using inductively coupled plasma (ICP) with hydrogen ($H_2$) and fluorine-based chemistry. The fluorine-based gases may be hexa-fluoro-ethane ($C_2F_6$), octa-fluoro-cyclobutane ($C_4F_8$), and sulphur hexafluoride ($SF_6$). The gas ratios and ICP power may be adjusted to obtain anisotropic etch and selectivity to silicon and $SiO_2$. The ICP power also determines the nitride etch rate with higher power leading to higher etch rates (that is, the nitride etch is more aggressive). In the two-step RIE process, the ICP power may be first kept low during the etch of the low quality nitride 130 and then increased during the etch of the high quality nitride 128.

What remains are L-shaped spacers 134 of the high quality oxide 128 and disposable spacers 136 of the low quality nitride 130. The L-shaped spacers 134 and disposable spacers 136 are adjacent to gate structure 116.

Figure 5:
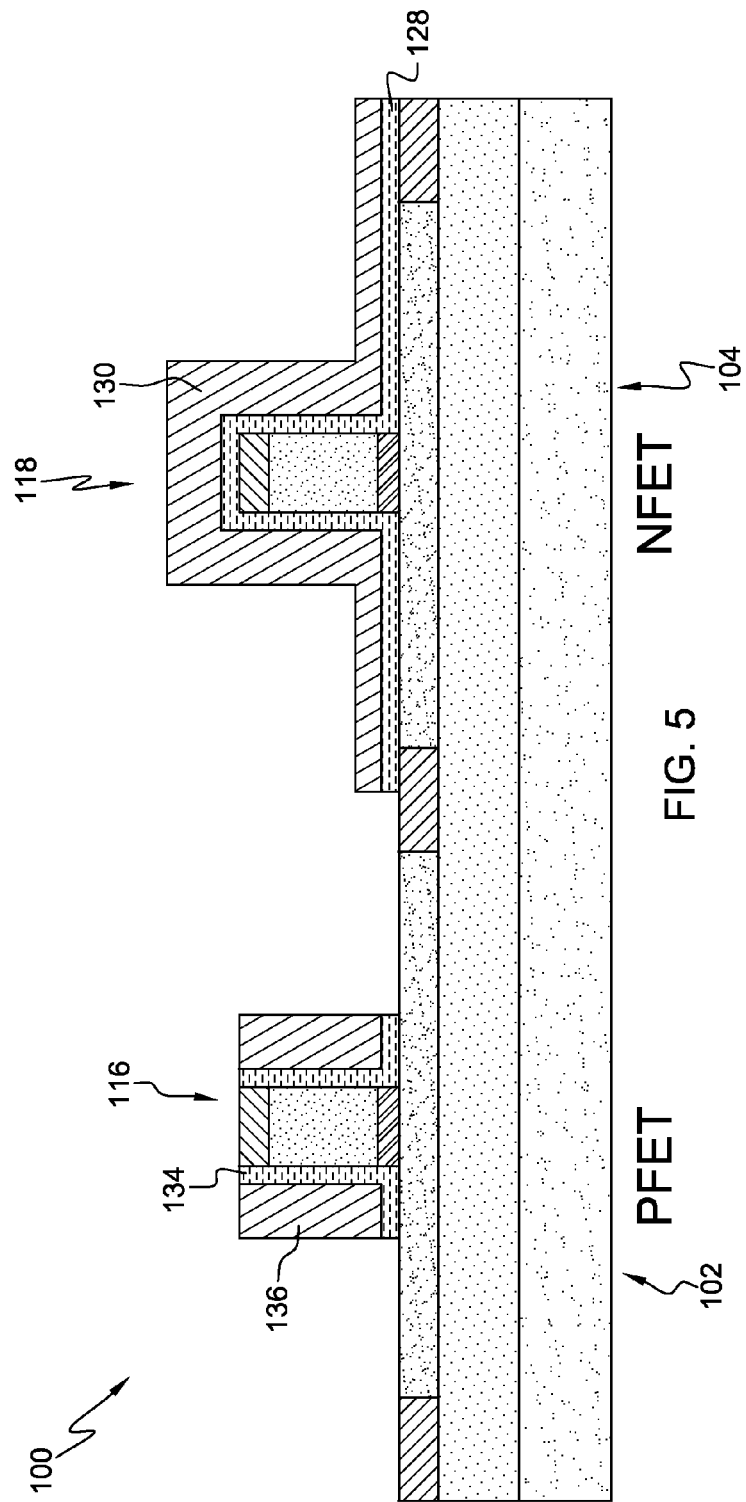

The photoresist mask 132 is then stripped to result in the structure shown in FIG. 5.

Figure 6:
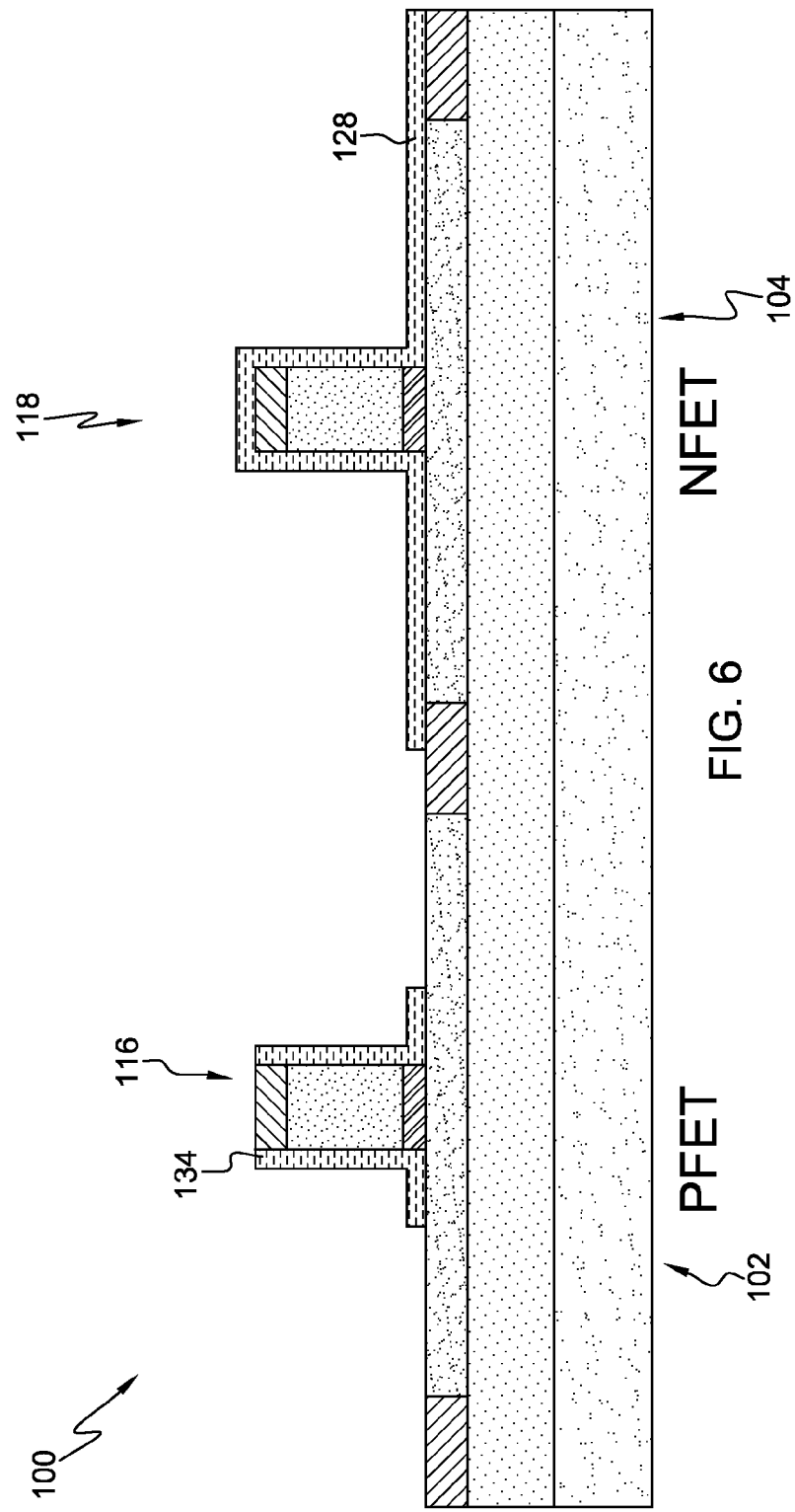

Thereafter, the disposable spacers 136 may be removed from the PFET portion 102 and the low quality nitride 130 is removed from the NFET portion 104 by a dilute HF etch as shown in FIG. 6.

Figure 7:
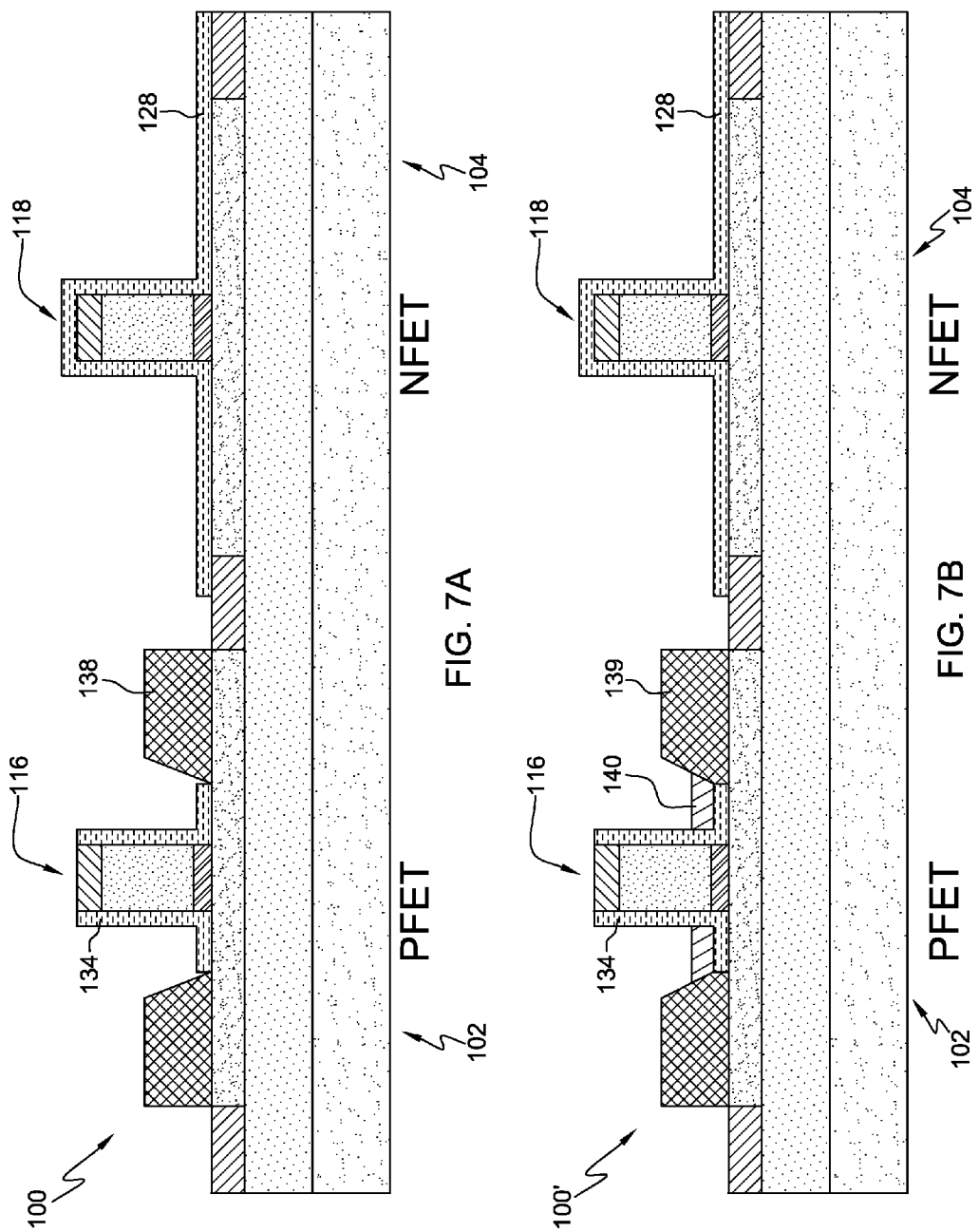

Referring now to FIGS. 7A and 7B, in-situ boron doped (ISBD) silicon germanium (SiGe) is epitaxially grown on the PFET portion to form the raised source/drain (RSD). The high quality nitride 128 serves as a mask to prevent deposition of SiGe on the NFET portion 104. The SiGe epitaxy may be performed using chemical vapor deposition (CVD). Typical epitaxy temperature is in the 600-850° C. range and pressure in the 1-100 torr range. The exact process temperature and pressure are chosen based on (i) the requirement that the SiGe epitaxy must be selective to oxide and nitride, that is, crystalline SiGe is deposited only on exposed crystalline Si, and crystalline SiGe is not deposited on exposed oxide (STI regions) and exposed nitride (PFET cap and spacers 134, and NFET high quality nitride 128), (ii) the desired Ge concentration in SiGe, and (iii) the gas sources of Si and Ge used in the process. Typical gases used may be (i) silane ($SiH_4$), dichlorosilane ($SiH_2Cl_2$), or silicon tetrachloride ($SiCl_4$) as source of Si, and (ii) germane ($GeH_4$), germanium tetrachloride ($GeCl_4$), or isobutyl germane ($C_4H_{12}Ge=(CH_3)_2CHCH_2GeH_3$) as source of Ge.

Referring first to FIG. 7A, the RSD 138 in semiconductor structure 100 may be totally faceted due to the growth conditions of the ISBD SiGe. In FIG. 7B, the RSD in semiconductor structure 100' may be a hybrid epitaxial in that there will be a faceted RSD 139 but the portion 140 of the ISBD SiGe that grows on the L-shaped spacers 134 will be amorphous due to the L-shaped spacers 134 being noncrystalline (being formed of high quality nitride). No amorphous SiGe may grow on nitride 128 since it is noncrystalline and there is no crystalline seed to start growth of even amorphous SiGe.

Either of the RSD 138 or 139 may be used in the exemplary embodiments but for purposes of illustration and not limitation, the RSD 138 is used in the following description of the exemplary process.

Figure 8:
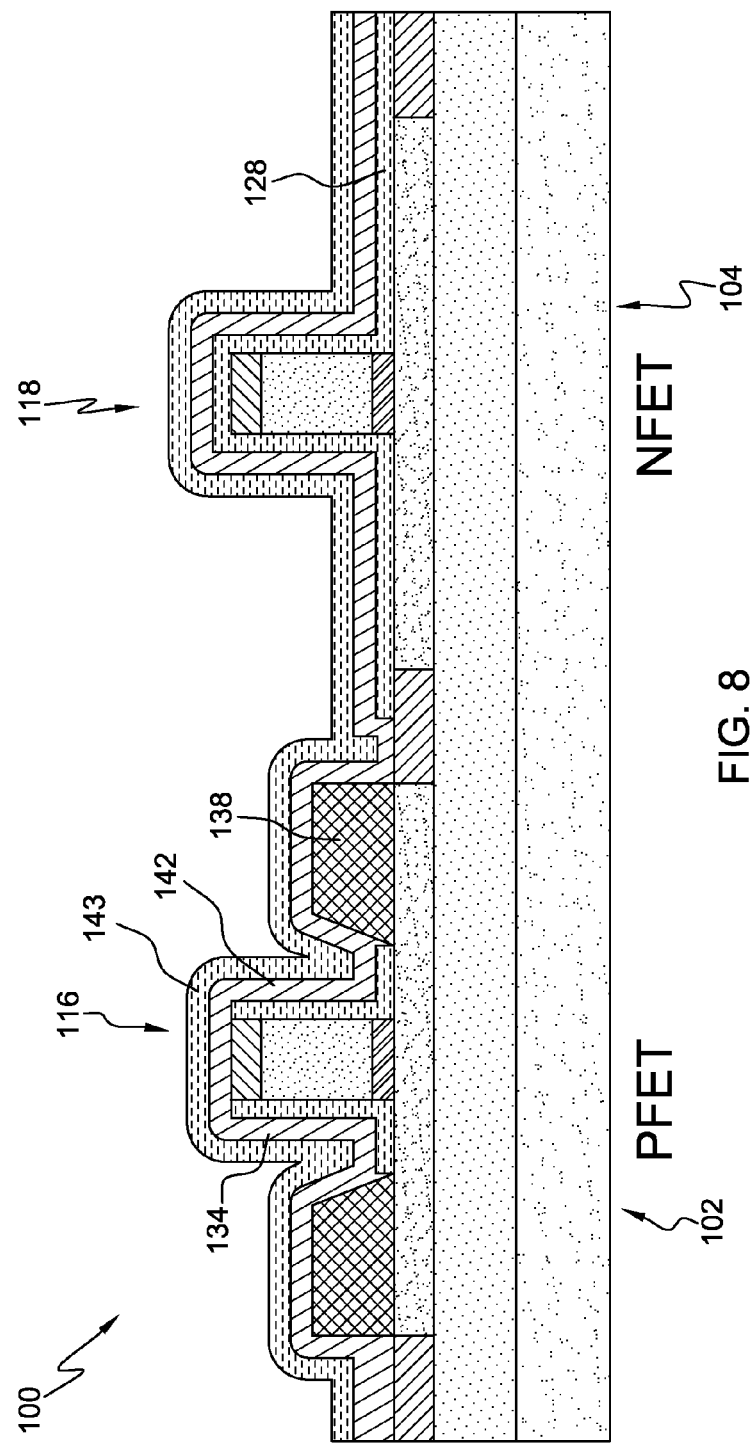

Then, as shown in FIG. 8, another low quality nitride layer 142 is deposited on the semiconductor structure 100 followed by a high quality nitride layer 143. The low quality nitride layer 142 may have a thickness of about 2 to 5 nanometers while the high quality nitride layer 143 may have a thickness of about 2 to 5 nanometers.

Figure 9:
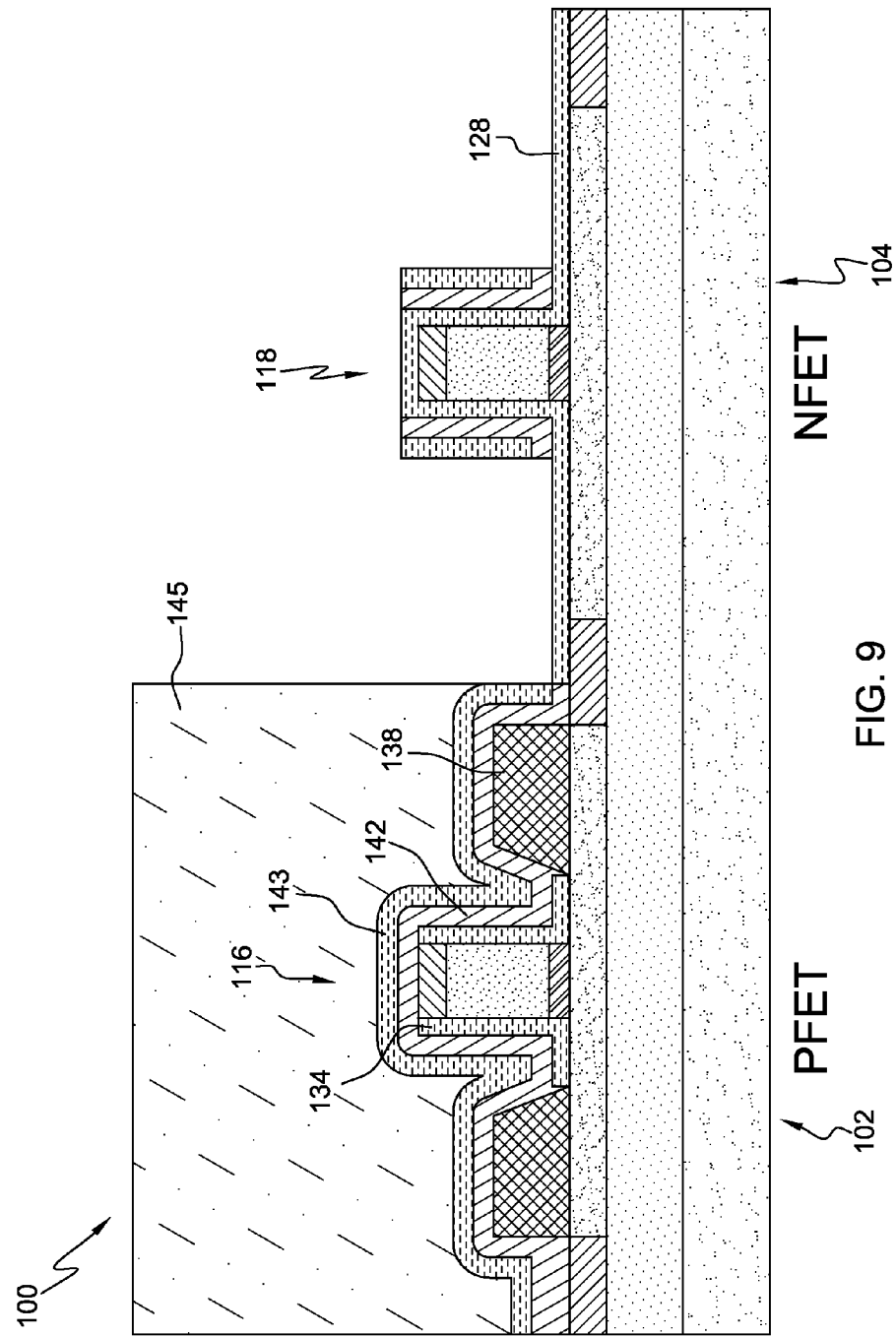

A photoresist mask 145 is defined over the PFET portion 102 as shown in FIG. 9. The semiconductor structure 100 then undergoes another two-step RIE process to remove horizontal portions of the high quality nitride 143 and the low quality nitride 142, stopping on high quality nitride 128. The operating parameters of the two-step RIE process may be similar to the two-step RIE process employed earlier.

Figure 10:
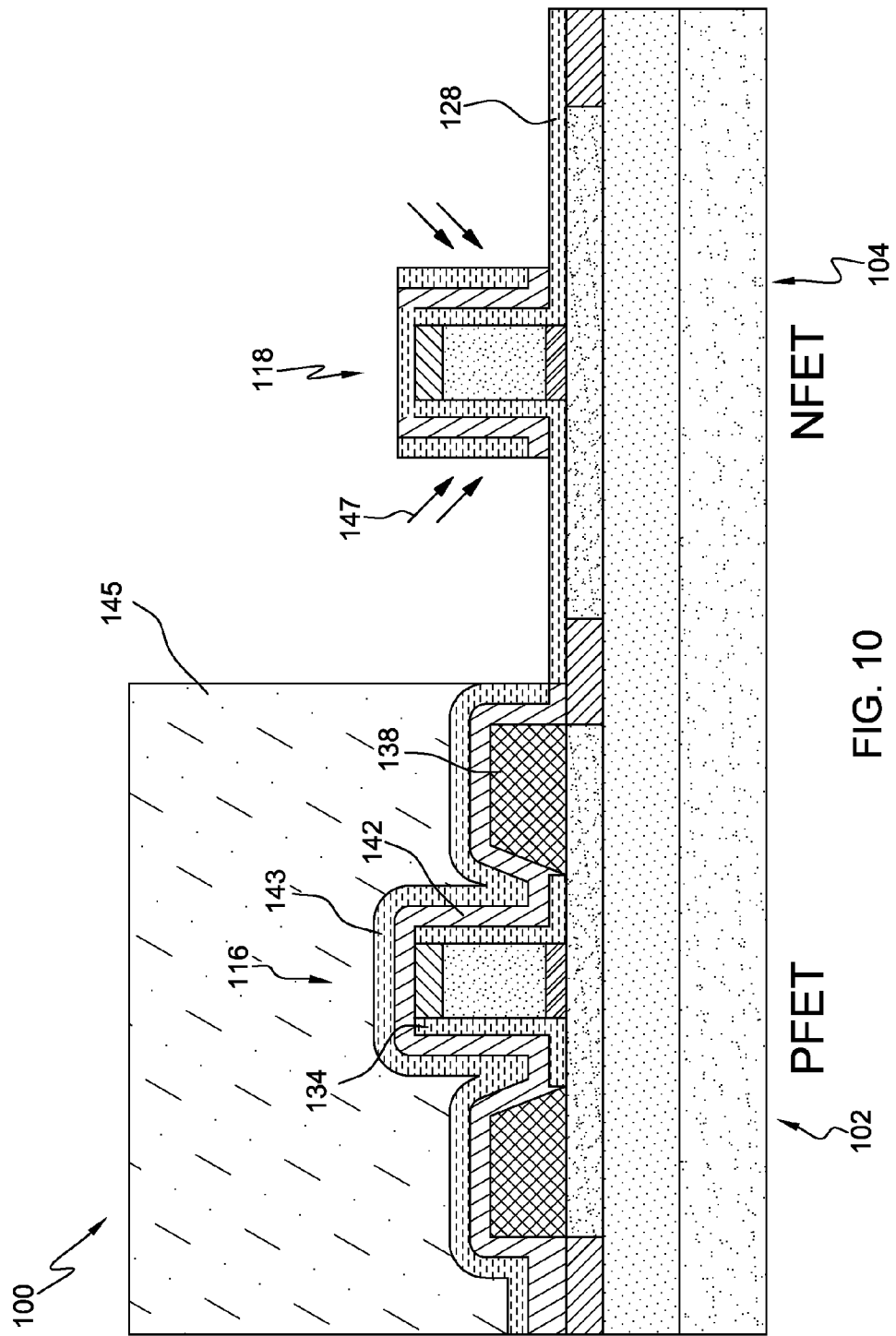

With the photoresist mask 145 covering the PFET portion 102, neutral species are implanted 147 to damage the high quality nitride layers 128,143 and the low quality nitride layer 142 in the NFET portion 104 as shown in FIG. 10. The neutral species may be, for example, Xe (xenon), N (nitrogen), Si or Ge. The implantation 147 damages the exposed nitride layers 128, 142, 143. The damaged portions of high quality nitride layers 128, 143 behave like low quality nitride and may be easily etched away in dilute HF.

Figure 11:
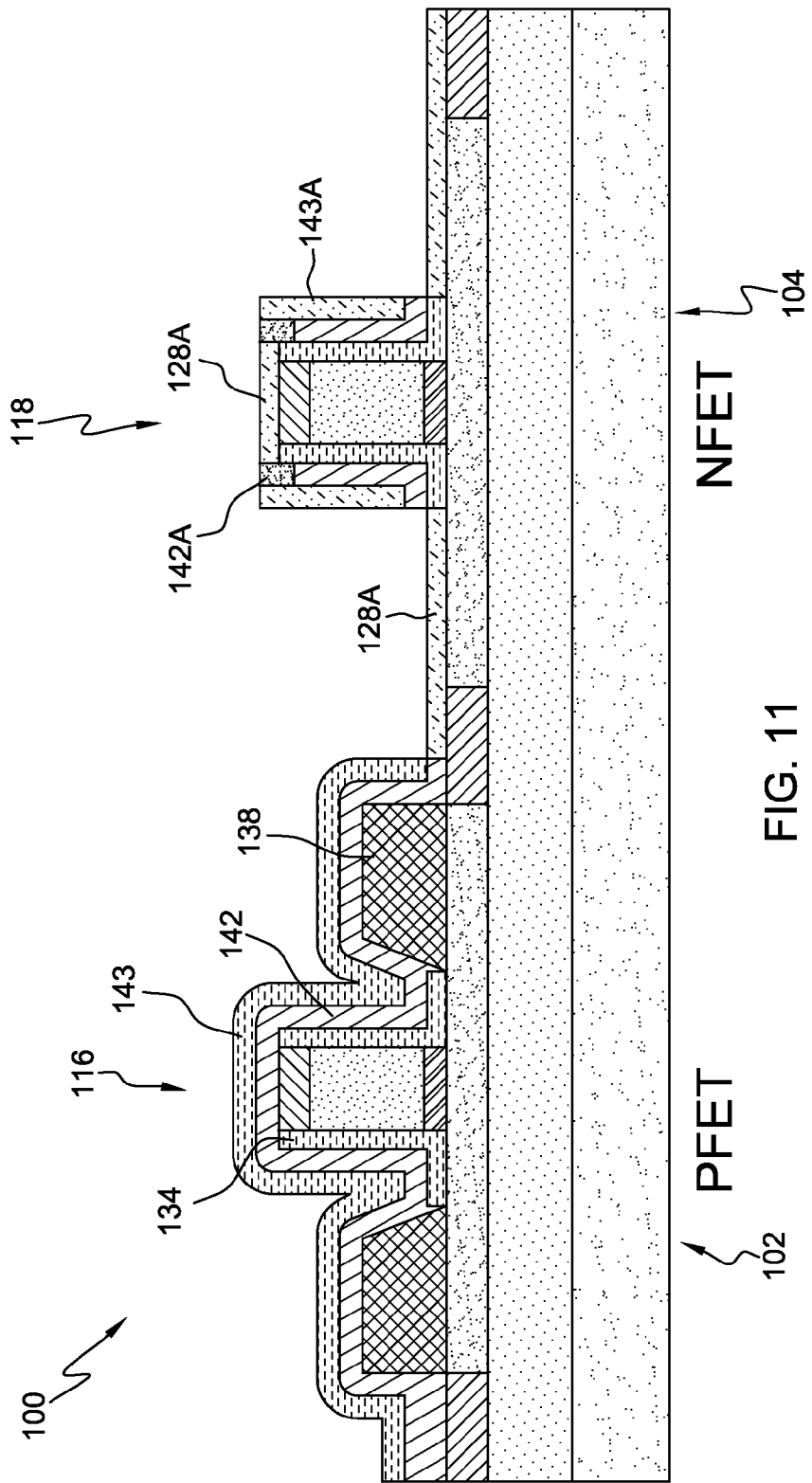

Referring now to FIG. 11, the photoresist mask 145 is conventionally stripped. Illustrated in the NFET portion 104 are the damaged portions 128A, 143A of the high quality nitride layer 128, 143. Portions of the low quality nitride layer 142 may also be damaged as indicated by damaged portions 142A. Damage to the low quality nitride layer 142 does not affect the process since it is easily etched away in dilute HF anyways. Since the PFET portion 102 was protected by the photoresist mask 145, none of the nitride layers have been damaged due to the implantation described with respect to FIG. 10.

Figure 12:
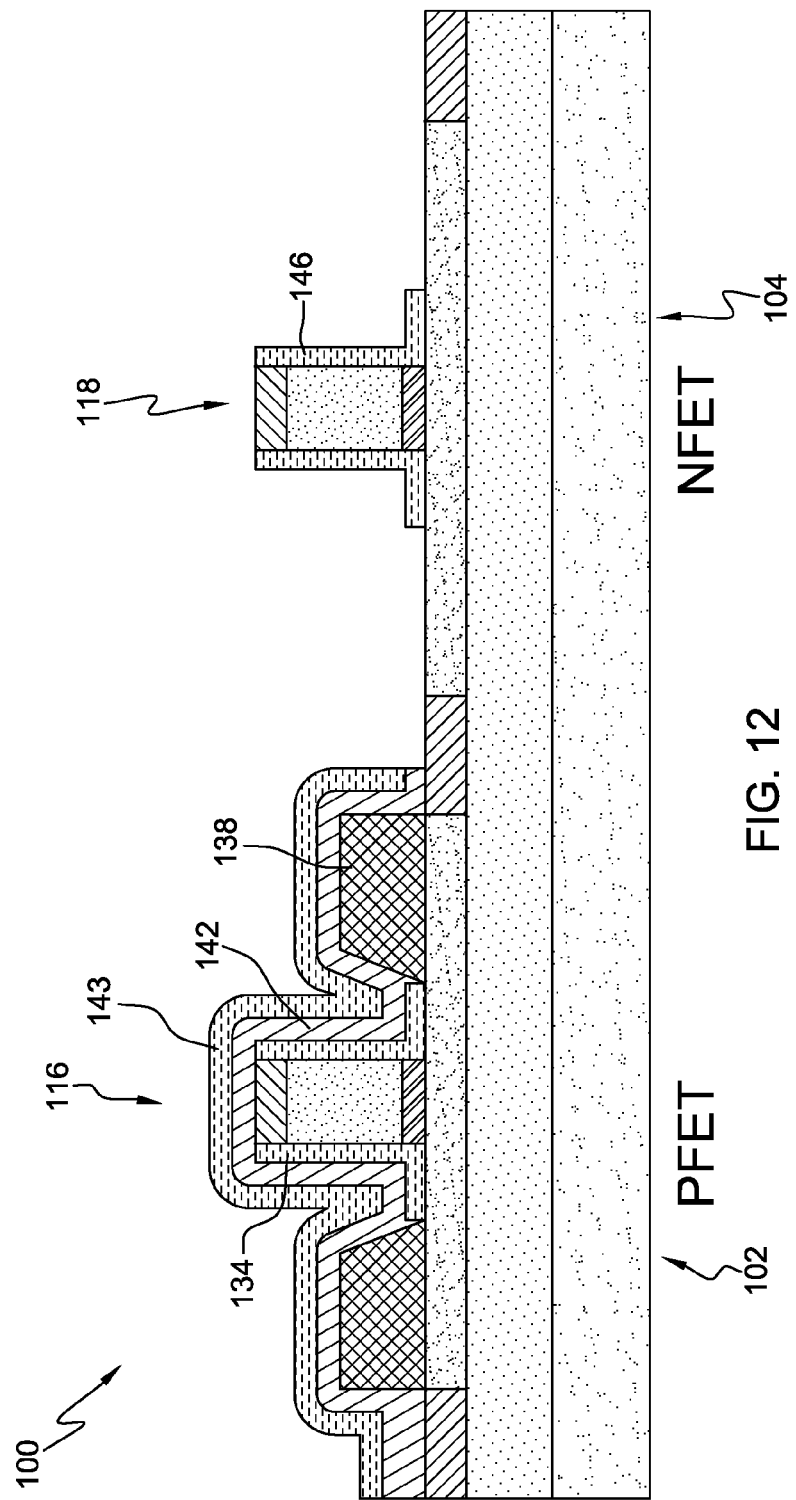

The semiconductor structure is then exposed to a dilute HF etch which removes all of the damaged portion 128A, 143A of the high quality nitride layers 128, 143 as well as the low quality nitride 142, 142A in the NFET portion 104. The resulting structure is shown in FIG. 12 with the NFET portion 104 having L-shaped spacers 146 of high quality nitride adjacent to gate structure 118.

Figure 13:
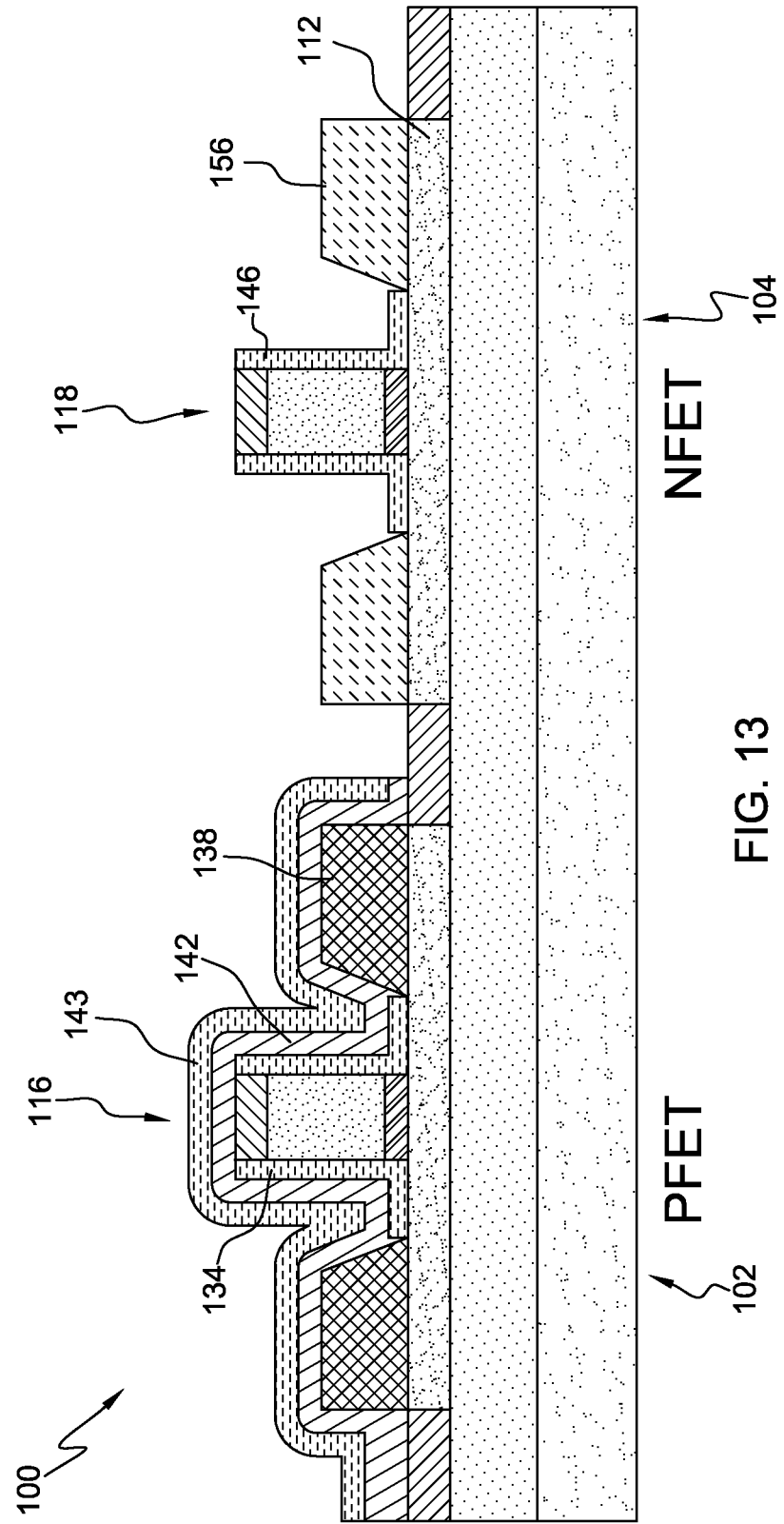

Referring now to FIG. 13, the semiconductor structure 100 undergoes a cyclic epitaxial process to grow cyclic epitaxial silicon on the NFET portion 104.

Cyclic epitaxial deposition involves deposition and etch cycles. During the deposition cycle, crystalline epitaxial silicon is grown off exposed silicon from the ETSOI layer 112 because the silicon in the ETSOI layer 112 is crystalline. Amorphous silicon is deposited on non-crystalline surfaces such as the high quality nitride layer 143 in the PFET portion 102 and the nitride in spacers 146 in the NFET portion 104. During the etch cycle, the process is tuned to etch away the amorphous silicon. By controlling the etch cycles, it is possible to grow crystalline RSD 156 on the crystalline silicon in the ETSOI layer 112 in the NFET portion 104 without growing crystalline silicon on the PFET portion 102. Masking the PFET portion 102 during the cyclic epitaxial silicon process thus become unnecessary.

Figure 20:
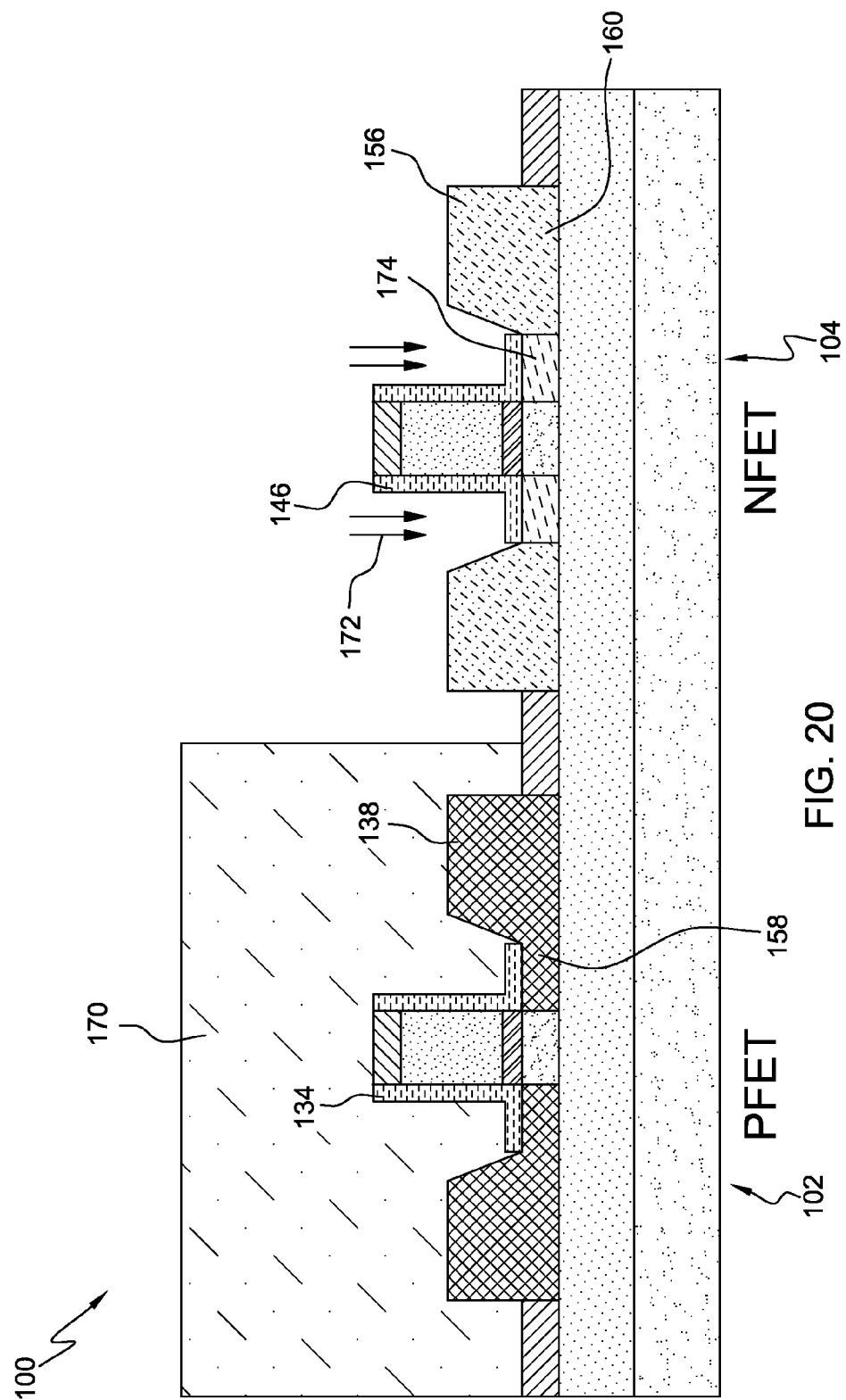

The crystalline RSD 156 may be in-situ phosphorus doped (ISPD) silicon, ISPD silicon carbide (SiC) or undoped silicon. If the RSD 156 is doped, the semiconductor structure 100 may then undergo a rapid thermal anneal to drive in boron from the ISBD SiGe RSD 138 into PFET extension regions 158 and phosphorus from the NFET RSD 156 into ETSOI region 160 for better/lower link-up resistance as shown in FIG. 20. If RSD 156 is ISPD SiC, for all practical purposes only the phosphorus diffuses because of the much lower diffusion constant of carbon.

If the crystalline RSD 156 is undoped silicon, further processing is necessary to dope the RSD 156. This further processing is illustrated in FIGS. 16 to 19 to be discussed hereafter. But first, the high quality nitride layer 143 and low quality nitride layer 142 needs to be removed from the PFET portion 102.

Figure 14:
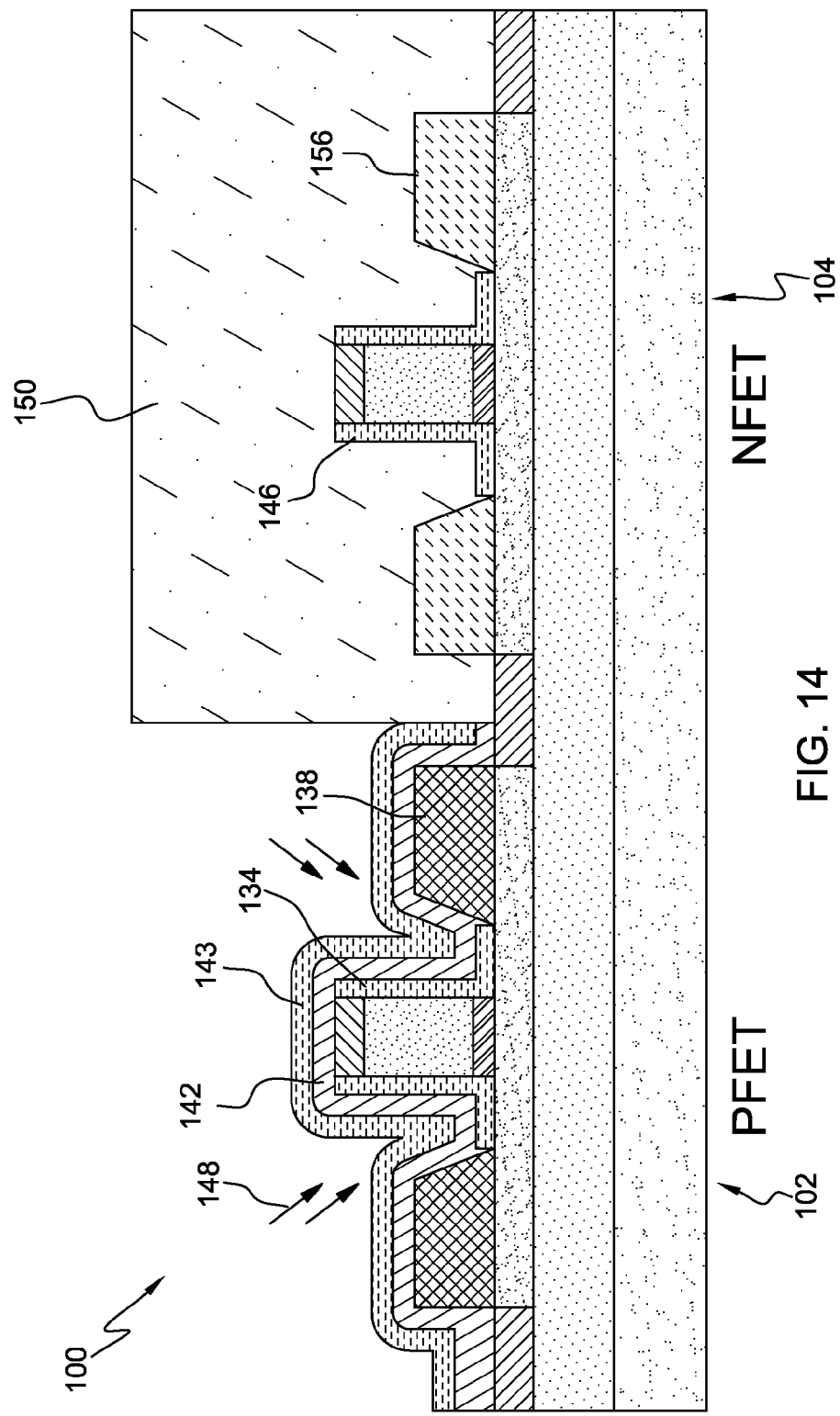

Referring to FIG. 14, a photoresist mask 150 is defined over the NFET portion 104. With the photoresist mask 150 covering the NFET portion 104, neutral species are implanted 148 to damage the high quality nitride layer 143 in the PFET portion 102. The neutral species may be, for example, Xe, N, Si or Ge. The implantation 148 damages the exposed high quality nitride layer 143 so that the damaged portions of high quality nitride layer 143 behave like low quality nitride and may be easily etched away in dilute HF.

Figure 15:
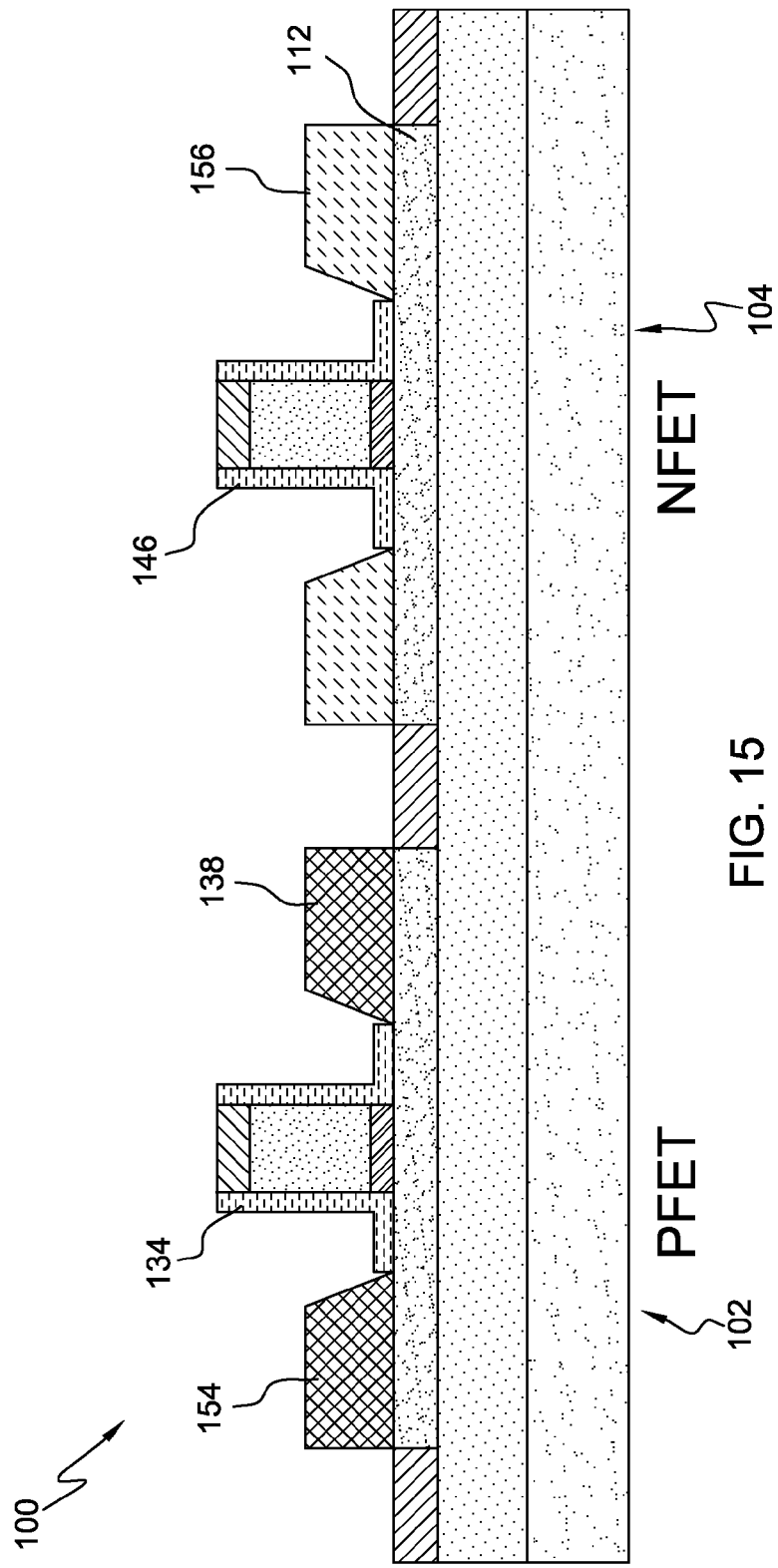

Thereafter, the photoresist mask 150 is conventionally stripped and then the semiconductor structure 100 is subjected to a dilute HF etch which removes the damaged high quality nitride layer 143 and the underlying low quality nitride layer 142 resulting in the structure shown in FIG. 15.

Figure 16:
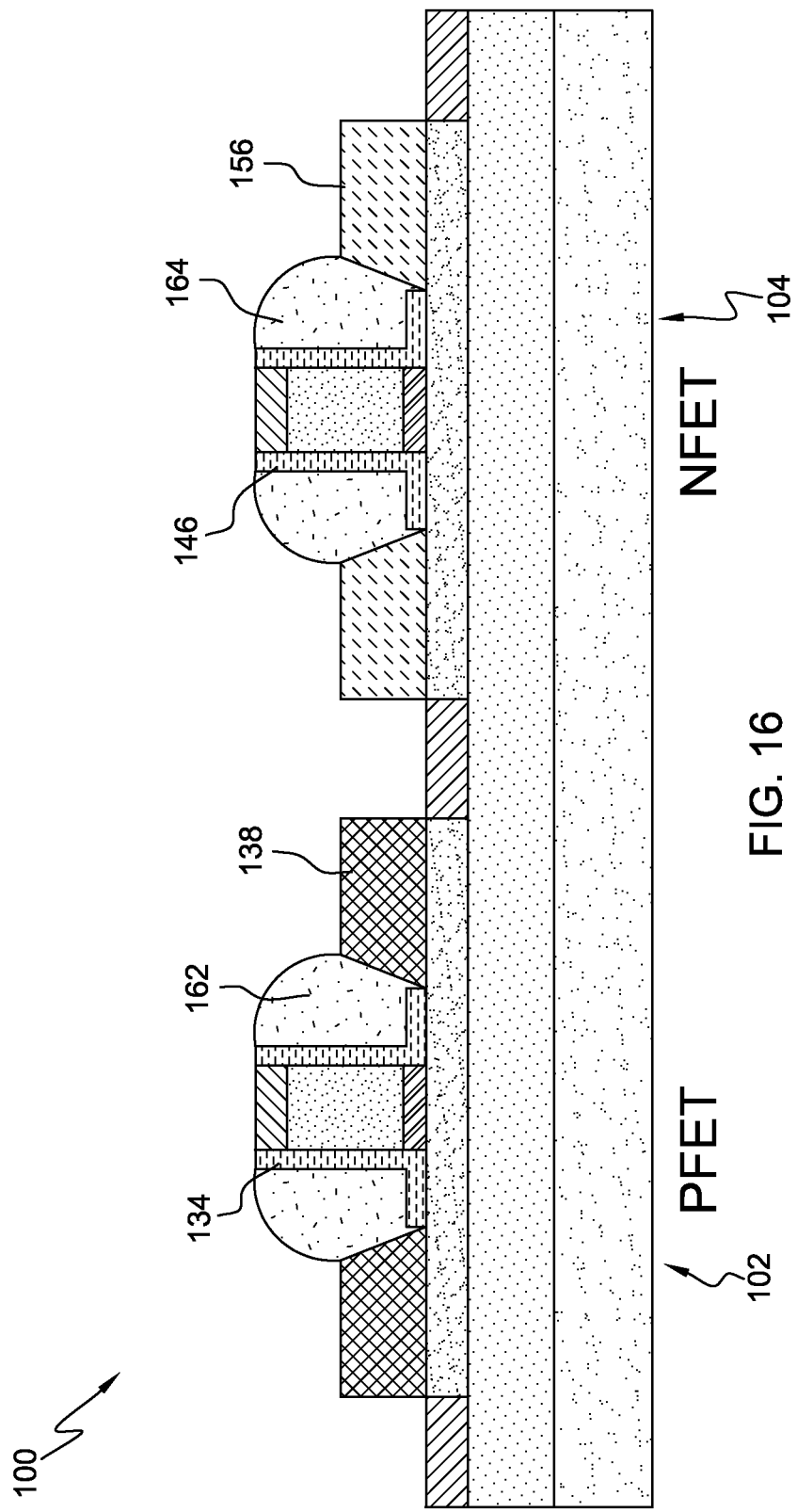
Figure 17:
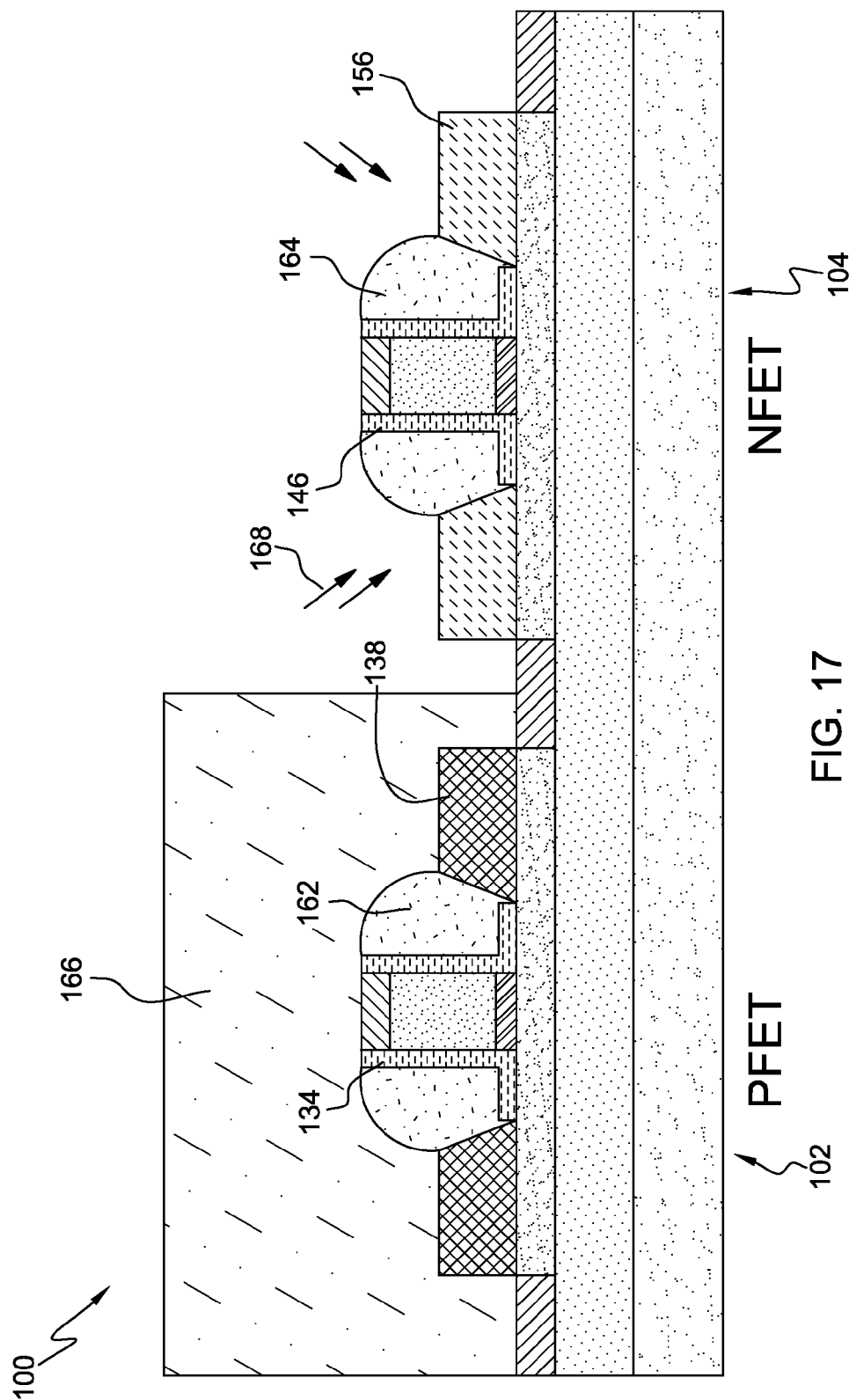
Figure 18:
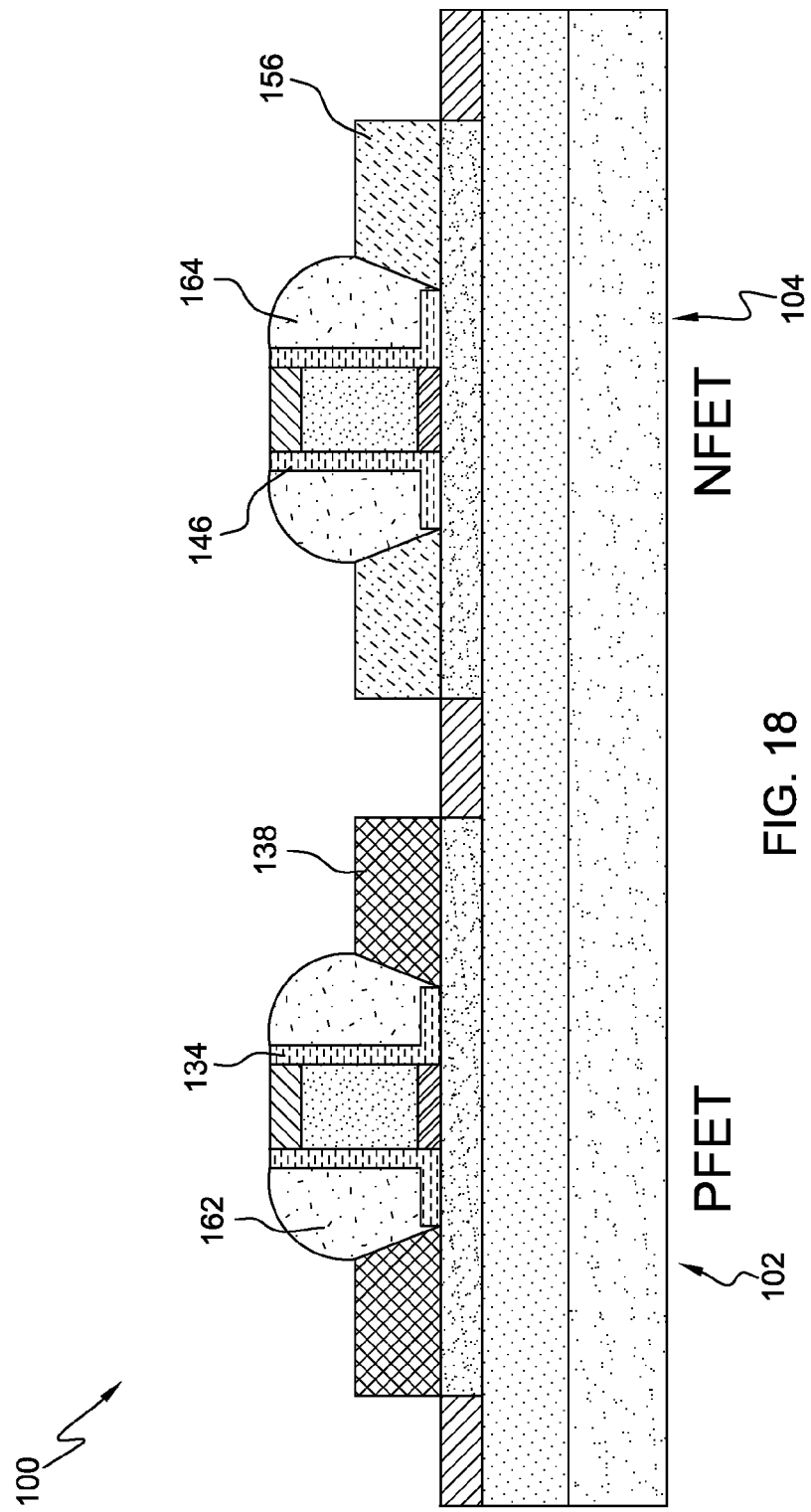
Figure 19:
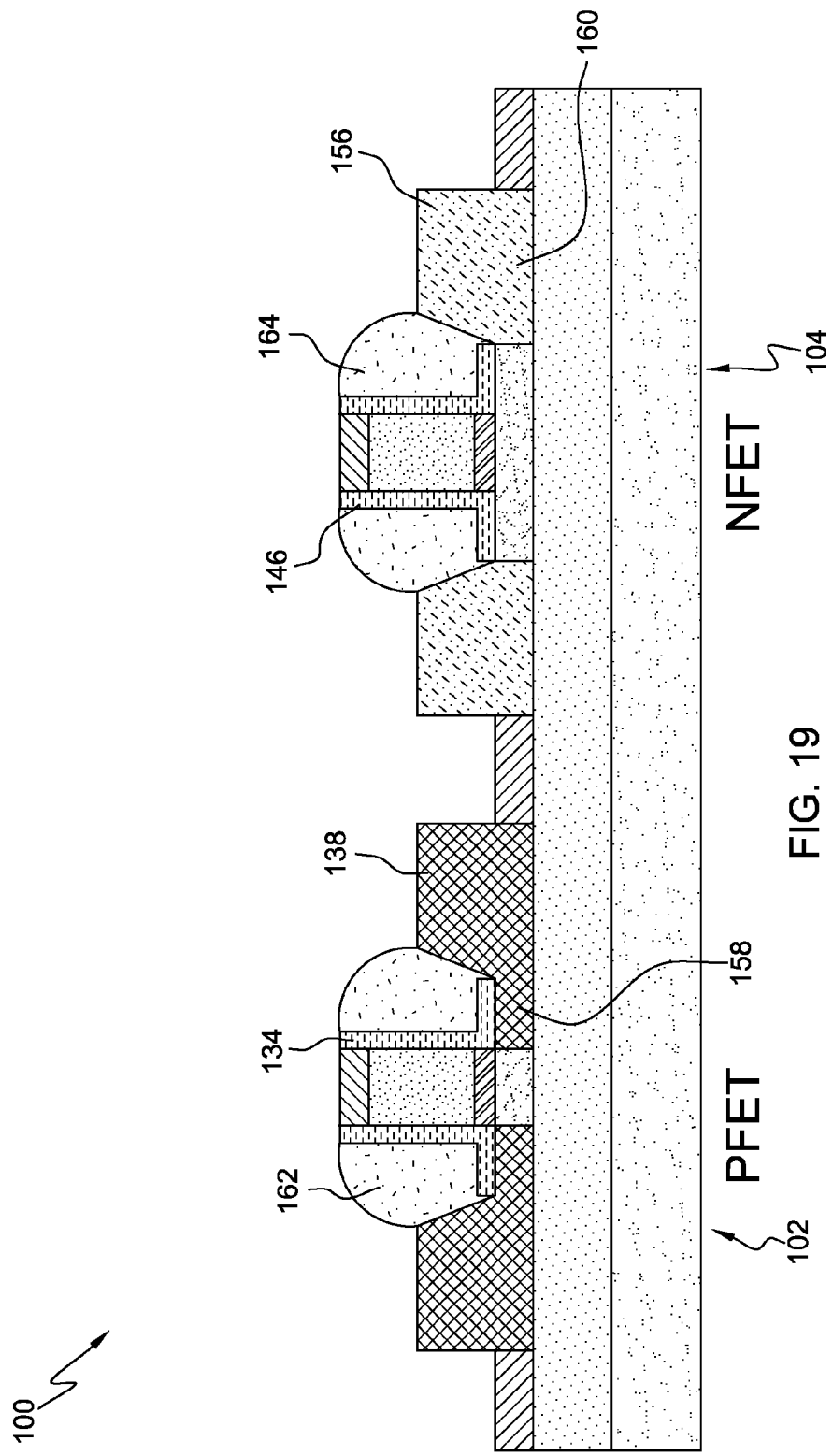

Referring now to FIG. 16 wherein the process for the doping of the RSD 156 begins, an oxide is deposited and then etched by RIE to form spacers 162 in PFET portion 102 and spacers 164 in NFET portion 104. Then, as shown in FIG. 17, a photolithographic mask 166 is patterned over the PFET portion 102 to protect the PFET portion 102 while exposing the NFET portion 104. The RSD 156 may then be exposed to conventional ion implanting 168 to dope the RSD 156 with, for example, phosphorus or arsenic or antimony. The photolithographic mask 166 is then stripped resulting in the semiconductor structure 100 shown in FIG. 18. The semiconductor structure 100 may then undergo a rapid thermal anneal to drive in boron from the ISBD SiGe RSD 138 into PFET extension regions 158 and phosphorus into the NFET RSD 156 into ETSOI region 160 for better/lower link-up resistance as shown in FIG. 19. The dopants in NFET RSD 156 essentially do not diffuse into the NFET extension regions because of the low diffusion constant of the phosphorus/arsenic/antimony dopants in NFET RSD 156. The oxide spacers 162, 164 may be removed by a dilute HF etch.

Referring again to FIG. 20, a photolithographic mask 170 may be patterned over the PFET portion 102 to protect the PFET portion 102 while exposing the NFET portion 104. The NFET portion 104 may be exposed to conventional ion implanting to ion implant 172 to form extension implants 174 in NFET portion 104. The implanted species may be phosphorus, arsenic or antimony but arsenic or antimony are preferred because they are heavier than phosphorus and may lead to much sharper doping profiles.

Figure 21:
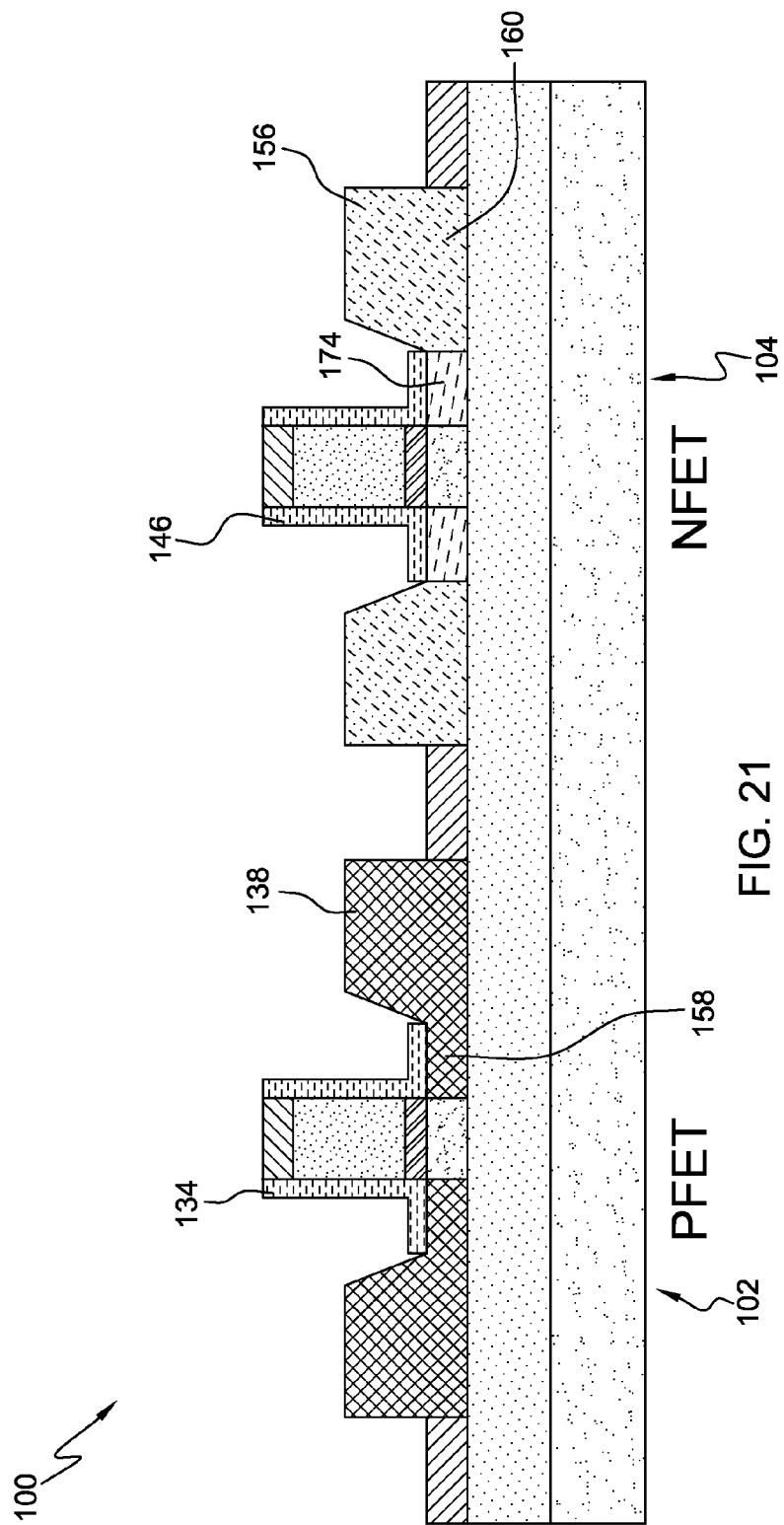

The photolithographic mask 170 may be conventionally stripped as shown in FIG. 21. Then, a short time anneal such as a laser anneal or a flash anneal is performed on semiconductor structure 100 to activate the NFET extension implants 174 but not to diffuse them. A conventional rapid thermal anneal is greater than one second in duration. However, a laser anneal is about 1 millisecond and a flash anneal is about 10 milliseconds, which are too short in time to lead to any significant diffusion of the dopants.

Figure 22:
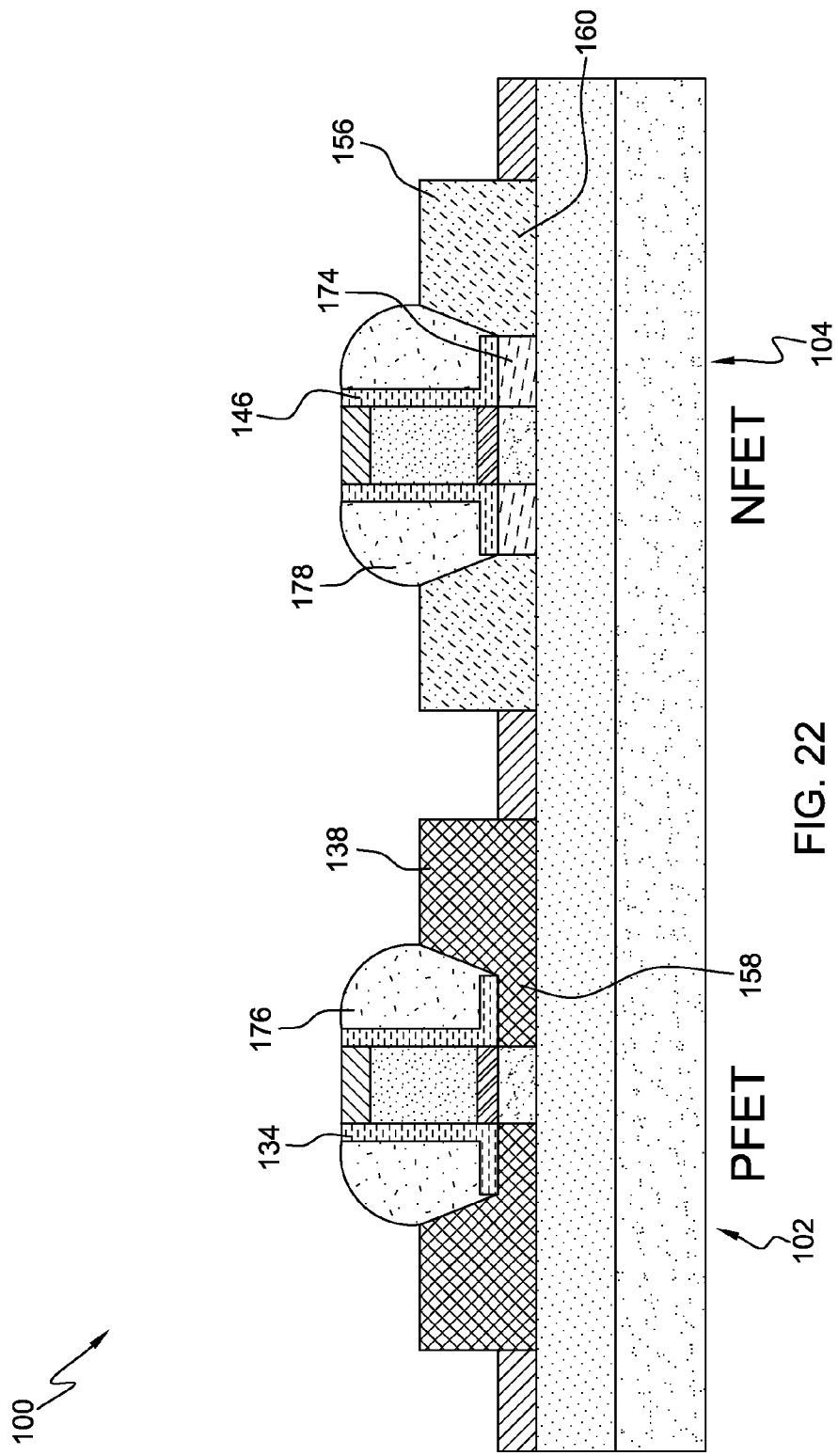

Referring now to FIG. 22, nitride spacers 176, 178 may be formed by depositing nitride and then reactive ion etching to form nitride spacers 176 on PFET portion 102 and nitride spacers 178 on NFET portion 104.

Figure 23:
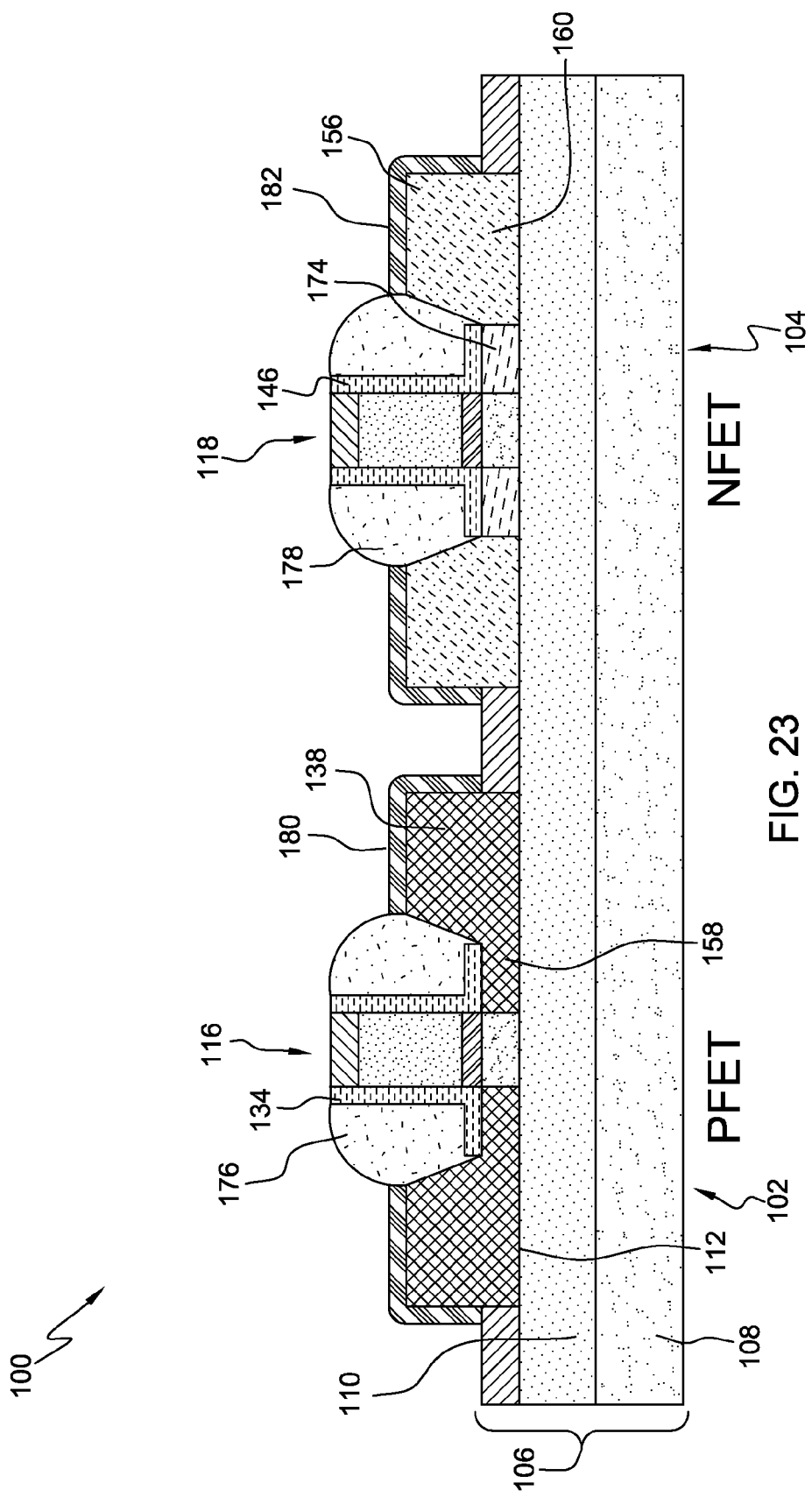

Conventional silicide processing may be performed to form silicide 180 in PFET region 102 and silicide 182 in NFET region 104 as illustrated in FIG. 23.

Figure 24:
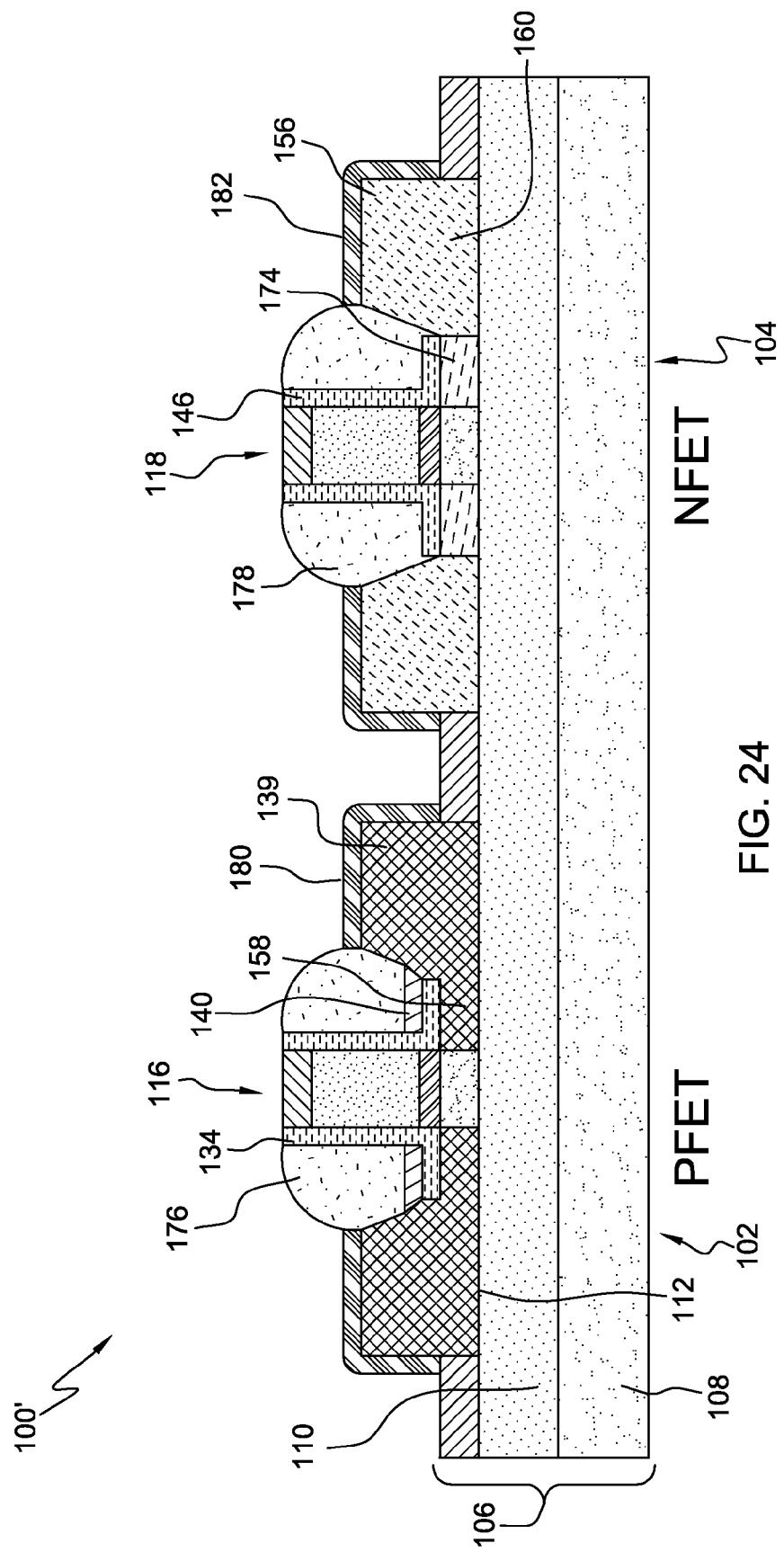

FIG. 24 is similar to FIG. 23 but shows semiconductor structure 100' with the hybrid RSD 139 and amorphous portion 140 illustrate in FIG. 7B.

Further conventional front end of the line, middle of the line and back end of the line processing may be performed to form finished semiconductor devices from semiconductor structure 100 and semiconductor structure 100'.

It will be apparent to those skilled in the art having regard to this disclosure that other modifications of the exemplary embodiments beyond those embodiments specifically described here may be made without departing from the spirit of the invention. Accordingly, such modifications are considered within the scope of the invention as limited solely by the appended claims.

What is claimed is:

1. A method of forming a semiconductor structure comprising:
    (a) obtaining an extra thin semiconductor on insulator (ETSOI) wafer having a PFET portion where a p-type field effect transistor (PFET) will be formed and an NFET portion where an n-type field effect transistor (NFET) will be formed;
    (b) forming at least one gate structure in the PFET portion and at least one gate structure in the NFET portion;
    (c) depositing a first high quality nitride over the PFET portion and the NFET portion, the high quality nitride being unetchable in dilute hydrofluoric acid (HF);
    (d) depositing a first low quality nitride over the first high quality nitride, the first low quality nitride being etchable in dilute HF;
    (e) etching the PFET portion to remove the first high quality nitride and first low quality nitride except for first high quality nitride and first low quality nitride adjacent to the at least one gate structure in the PFET portion;
    (f) etching the PFET portion and the NFET portion to remove the first low quality nitride, resulting in first high quality nitride spacers adjacent to the at least one gate structure in the PFET portion and first high quality nitride over the NFET portion;
    (g) forming doped faceted epitaxial silicon/germanium (SiGe) on the ETSOI adjacent to the first high quality nitride and the at least one gate structure in the PFET portion to form a faceted raised source/drain (RSD) in the PFET portion;
    (h) depositing a second low quality nitride over the PFET portion and the NFET portion and depositing a second high quality nitride over the second low quality nitride;
    (i) etching the NFET portion to remove the second high quality nitride and the second low quality nitride except for second high quality nitride and second low quality nitride adjacent to the at least one gate structure in the NFET portion;
    (j) ion implanting into the NFET portion to damage the first and second high quality nitrides;
    (k) etching the NFET portion to remove the damaged first and second high quality nitrides and the second low quality nitride resulting in first high quality nitride spacers adjacent to the at least one gate structure in thee NFET portion;
    (l) ion implanting to damage the second high quality nitride in the PFET portion;
    (m) etching to remove the damaged second high quality nitride and second low quality nitride from the PFET portion;
    (n) forming a faceted epitaxial silicon RSD on the ETSOI adjacent to the first high quality nitride spacers in the NFET portion;
    (o) performing a rapid thermal anneal;
    (p) ion implanting extensions into the ETSOI underneath the at least one gate structure in the NFET portion; and
    (q) performing a short time scale anneal to activate the NFET extension implants but not diffuse them.

2. The method of claim 1 wherein step (i) comprises two etching steps such that a first etching step comprises etching the second high quality nitride from the NFET portion and a second etching step comprises etching the second low quality nitride from the NFET portion wherein the second etching step has different etching parameters than the first etching step.

3. The method of claim 1 wherein forming in step (n) comprises a cyclic epitaxial process.

4. The method of claim 3 wherein epitaxial material is not formed on the RSD in the PFET portion during the cyclic epitaxial process.

5. The method of claim 1 wherein the epitaxial silicon formed in step (n) is undoped silicon.

6. The method of claim 5 further comprising the steps between step (n) and step (o) of forming oxide spacers adjacent to the high quality nitride in the NFET portion, masking the PFET portion and ion implanting into the RSD in the NFET portion and step (o) of performing a rapid thermal anneal includes driving in dopants of the RSD into the ETSOI in the PFET portion and NFET portion.

7. The method of claim 1 wherein the epitaxial silicon formed in step (n) is doped silicon and step (o) of performing a rapid thermal anneal includes driving in dopants of the RSD into the ETSOI in the PFET portion and NFET portion.

8. The method of claim 1 wherein the short time anneal in step (q) is a laser anneal or a flash anneal such that the anneal time is less than 10 milliseconds.

9. The method of claim 1 further comprising a step (r) of forming nitride spacers adjacent to the at least one gate structure in the PFET portion and the at least one gate structure in the NFET portion.

10. The method of claim 1 wherein in steps (j) and (m), ion implanting includes ion implanting a neutral species selected from the group consisting of Xe (xenon), nitrogen (N), silicon (Si) or germanium (Ge).

11. The method of claim 10 wherein the low quality nitride has an etch rate in dilute HF of more than about 10 nanometers per minute.

12. The method of claim 1 wherein dilute HF may be defined as having a range of $HF:H_2O$ (water) from 1:10 to 1:100 and the high quality nitride is a nitride that has an etch rate in dilute hydrofluoric (HF) acid of less than about 1 nanometer per minute.

13. A method of forming a semiconductor structure comprising:
    (a) providing a semiconductor structure comprising an extra thin semiconductor on insulator (ETSOI) wafer having a PFET portion where a p-type field effect transistor (PFET) will be formed and an NFET portion where an n-type field effect transistor (NFET) will be formed, at least one gate structure in the PFET portion and at least one gate structure in the NFET portion, a high quality nitride spacer adjacent to the at least one gate structure in the PFET portion and a high quality nitride spacer adjacent to the at least one gate structure in the NFET portion, the high quality nitride being unetchable in dilute hydrofluoric acid (HF), and a doped faceted epitaxial silicon germanium raised source/drain (RSD) in the PFET portion;
    (b) depositing a low quality nitride over the PFET portion and the NFET portion and depositing a high quality nitride over the low quality nitride, the low quality nitride being etchable in dilute HF;
    (c) etching the NFET portion to remove the high quality nitride and the low quality nitride except for high quality nitride and low quality nitride adjacent to the high quality nitride spacer in the NFET portion;
    (d) ion implanting into the NFET portion to damage the high quality nitride;
    (e) etching the NFET portion to remove the damaged high quality nitride and the low quality nitride resulting in the high quality nitride spacers adjacent to the at least one gate structure in the NFET portion;
    (f) ion implanting to damage the high quality nitride in the PFET portion;
    (g) etching to remove the damaged high quality nitride and the low quality nitride from the PFET portion;
    (h) forming a faceted epitaxial silicon RSD on the ETSOI adjacent to the high quality nitride spacer in the NFET portion;
    (i) performing a rapid thermal anneal;
    (j) ion implanting extensions into the ETSOI underneath the at least one gate structure in the NFET portion; and
    (k) performing a short time scale anneal to activate the NFET extension implants but not diffuse them.

14. The method of claim 13 wherein forming in step (h) comprises a cyclic epitaxial process.

15. The method of claim 14 wherein epitaxial material is not formed on the RSD in the PFET portion during the cyclic epitaxial process.

16. The method of claim 15 further comprising the steps between step (h) and step (i) of forming oxide spacers adjacent to the high quality nitride in the NFET portion, masking the PFET portion and ion implanting into the RSD in the NFET portion and step (i) of performing a rapid thermal anneal includes driving in dopants of the RSD into the ETSOI in the PFET portion and NFET portion.

17. The method of claim 13 wherein the epitaxial silicon formed in step (h) is undoped silicon.

18. The method of claim 13 wherein the epitaxial silicon formed in step (h) is doped silicon and step (i) of performing a rapid thermal anneal includes driving in dopants of the RSD into the ETSOI in the PFET portion and NFET portion.

19. The method of claim 13 wherein the short time scale anneal in step (k) is a laser anneal or a flash anneal such that the anneal time is less than 10 milliseconds.

20. The method of claim 13 further comprising a step (l) of forming nitride spacers adjacent to the at least one gate structure in the PFET portion and the at least one gate structure in the NFET portion.

21. The method of claim 13 wherein in steps (d) and (f), ion implanting includes ion implanting a neutral species selected from the group consisting of Xe (xenon), nitrogen (N), silicon (Si) or germanium (Ge).

22. The method of claim 13 wherein dilute HF may be defined as having a range of $HF:H_2O$ (water) from 1:10 to 1:100 and the high quality nitride is a nitride that has an etch rate in dilute hydrofluoric (HF) acid of less than about 1 nanometer per minute.

23. The method of claim 22 wherein the low quality nitride has an etch rate in dilute HF of more than about 10 nanometers per minute.

* * * * *

UNITED STATES PATENT AND TRADEMARK OFFICE
CERTIFICATE OF CORRECTION

PATENT NO. : 8,546,203 B1  
APPLICATION NO. : 13/551100  
DATED : October 1, 2013  
INVENTOR(S) : Kangguo Cheng et al.

Page 1 of 1

It is certified that error appears in the above-identified patent and that said Letters Patent is hereby corrected as shown below:

On the Title Page, item (73), in the Assignee: after "International Business Machines
Corporation, Armonk, NY (US)"

insert --STMicroelectronics, Inc.
Coppell, TX 75019 (US)--

Signed and Sealed this
Fifth Day of August, 2014

Michelle K. Lee
*Deputy Director of the United States Patent and Trademark Office*